United States Patent
Österling et al.

(10) Patent No.: US 11,791,959 B2
(45) Date of Patent: Oct. 17, 2023

(54) METHODS, APPARATUS AND MACHINE-READABLE MEDIUMS FOR SIGNALLING IN A BASE STATION

(71) Applicant: Telefonaktiebolaget LM Ericsson (publ), Stockholm (SE)

(72) Inventors: Jacob Österling, Järfälla (SE); Fredrik Huss, Sundbyberg (SE); Tomas Lagerqvist, Stockholm (SE); Miguel Berg, Sollentuna (SE); Jan Roxbergh, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 424 days.

(21) Appl. No.: 17/289,257

(22) PCT Filed: Oct. 24, 2019

(86) PCT No.: PCT/SE2019/051049
§ 371 (c)(1),
(2) Date: Apr. 28, 2021

(87) PCT Pub. No.: WO2020/091655
PCT Pub. Date: May 7, 2020

(65) Prior Publication Data
US 2021/0399853 A1 Dec. 23, 2021

Related U.S. Application Data

(60) Provisional application No. 62/753,571, filed on Oct. 31, 2018.

(51) Int. Cl.
*H04L 5/00* (2006.01)
*H03M 7/30* (2006.01)
*H04W 72/044* (2023.01)

(52) U.S. Cl.
CPC ............ *H04L 5/0042* (2013.01); *H03M 7/30* (2013.01); *H04W 72/044* (2013.01)

(58) Field of Classification Search
CPC ...... H04L 5/0042; H03M 7/30; H04W 72/044
See application file for complete search history.

(56) References Cited

U.S. PATENT DOCUMENTS

| | | |
|---|---|---|
| 8,379,752 B2 | 2/2013 | Kleider et al. |
| 2004/0203979 A1 | 10/2004 | Attar et al. |

(Continued)

FOREIGN PATENT DOCUMENTS

| | | |
|---|---|---|
| EP | 1094401 A1 | 4/2001 |
| KR | 20160068278 A | 6/2016 |

OTHER PUBLICATIONS

Author Unknown, "XRAN-FH.CUS.0-v02.00", xRAN Fronthaul Working Group, Control, User and Synchronization Plane Specification, xRAN.org, Jul. 20, 2018, 1-156.

*Primary Examiner* — Natasha W Cosme
(74) *Attorney, Agent, or Firm* — Murphy, Bilak & Homiller, PLLC

(57) ABSTRACT

One embodiment of the disclosure provides a method performed by a first component part of a base station. The first component part comprises one of a central unit and a radio unit. The base station further comprises a second component part, which comprises the other of the central unit and the radio unit. The method comprises: receiving a user data stream to be transmitted to the second component part, the user data stream comprising a plurality of data samples which are for transmission by the base station over an air interface, or which have been received by the base station over the air interface; applying first and second scaling factors to the data samples to generate a scaled user data stream, wherein the first scaling factor is updateable every first plurality of data samples, wherein the second scaling (Continued)

factor is updateable every second plurality of data samples, and wherein the second plurality of data samples is less than the first plurality of data samples; and transmitting the scaled user data stream and an indication of the first and second scaling factors to the second component part.

20 Claims, 16 Drawing Sheets

(56) References Cited

U.S. PATENT DOCUMENTS

| | | |
|---|---|---|
| 2013/0121265 A1 | 5/2013 | Awoniyi et al. |
| 2015/0117470 A1 | 4/2015 | Ryan et al. |
| 2015/0348231 A1 | 12/2015 | Jo |

METHODS, APPARATUS AND MACHINE-READABLE MEDIUMS FOR SIGNALLING IN A BASE STATION

TECHNICAL FIELD

Embodiments of the disclosure relate to communication networks, and particularly to methods, apparatus and machine-readable mediums for signalling in a base station.

BACKGROUND

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

The current RAN architecture for 5G defines base stations (or gNBs) comprising multiple component parts: a central unit (CU), one or more distributed units (DUs), and one or more radio units (RUs). The protocol layer stack of the base station is divided between the CU, the DUs and the RUs, with one or more lower layers of the stack implemented in the RUs, and one or more higher layers of the stack implemented in the CU and/or DU. The CU is coupled to the DUs via a fronthaul higher layer split (HLS) network; the CU/DUs are connected to the RUs via a fronthaul lower-layer split (LLS) network.

The xRAN fronthaul working group has presented a fronthaul specification for interfacing between a LLS-CU (central unit/base band unit) and an RU (radio unit), supporting 3GPP LTE and NR. See CRAN-FH.CUS.0-v02.00, published Jul. 27, 2018 on 23w.xran.org.

The protocol consists of Data-associated control information messages (DACI) transferred from the LLS-CU to RU and containing information about how to treat User Data messages, transferred from the LLS-CU to RU, with content to be transmitted over the air, or controlling data to be received over the air and inserted in to User Data message transferred from the RU to LLS-CU. These User data messages will be called UD-DL (for downlink messages received over the air interface and forwarded from the RU to LLS-CU) and UD-UL (for uplink messages to be transmitted over the air interface and forwarded from the LLS-CU to the RU).

The DACI exists of different types, where the most common is the one with Section Type 1, containing information on how regular transmissions are to be done. A Section Type 1 DACI message contains a list of Sections, each Section stating (amongst other things):
    An identifier to map the DACI and UD-DL or UD-UL: Section ID
    A logical RU_port to support multiple overlapping (in time/frequency) and independent address ranges of identifiers.
    A data direction: UL/DL
    A range of Physical Resource Blocks (PRBs)
    A range of symbols
    Information as to which Resource Elements (Res) in the PRB range the rest of the information relates to
    Optional beam forming index or weights
    Optional compression method for beam forming weights
    User data format and optional compression method
The UD-DL and UD-UL messages comprise:
    The corresponding identifiers (Section ID and RU_port) as the corresponding Section Type 1 message.
    User data format and optional compression
    1 sample per RE, in any of the supported formats
This is exemplified by the signaling shown in FIG. 1. It shows three scenarios:
    A. A DACI message is sent from the LLS-CU to the RU with information describing a forthcoming reception. The RU sends on or more UD-UL messages in correspondence with the request containing samples of the received signal over the air.
    B. A DACI message is sent from the LLS-CU to the RU with information describing a coming transmission. The LLS-CU then transmits one or more UD-DL messages containing the information to be transmitted over the air.
    C. Two different DACI messages are sent from the LLS-CU to the RU with information describing a forthcoming transmission. The two DACI messages describe the transmission method for different REs in the same symbol in the same PRB. The LLS-CU then transmits one or more UD-DL messages containing the information to be transmitted into the air, combined for the two DACI.

A high level illustration of the protocol of the DACI and UD-UL/UD-DL is shown in FIG. 2. The DACI messages contain a common header, indicating amongst other things the RU_Port_ID for the DACI, and then a variable set of Sections, each describing a forthcoming transmission. The UD-UL and UD-DL messages (collectively, UD-XX) contain a common header, indicating amongst other things the RU_Port_ID for the UD-XX message, and then a variable set of sections, each containing a section header indicating the content of the data field, and a data field. The section header also contains the SectionID to map to the corresponding Section of the DACI message and the format of the data in the data field.

The xRAN LLS specification also contains a set of compression methods for IQ samples. Two such methods are:
    Block floating point
    Block scaling
In both of these methods, the samples for a PRB, i.e. 12 samples of I and 12 samples of Q, are expressed as a combination of a sample unique factor and a common factor.

In the block floating point format, the sample unique factor is a mantissa and the common factor is an unsigned exponent. To decompress, the unique value is multiplied with 2"common factor.

In the block scaling point format, the sample unique factor is a first factor, and the common factor is a second factor. To decompress, the unique value is multiplied with the common factor.

For simplicity, both of these are called block scaling in the text below, as the block floating point is merely a logarithmically quantized scaling factor.

There currently exist certain challenge(s).

One problem with the existing sample compression methods is that they are non-efficient, i.e. they spend too many bits to accomplish a wanted quantization noise, i.e. dynamic range. This is due to the high variability of the signal within a PRB. Secondly, the repetition of the carrier scaling factor (second factor) every PRB is unnecessary if the dynamicity is improved within the PRB Certain aspects of the present disclosure and their embodiments may provide solutions to these or other challenges.

SUMMARY

Embodiments of the disclosure relate to sending UL and DL samples between the radio unit and the base band signal processing. Embodiments of the disclosure operate on the data stream coming from one antenna or going to one antenna. Embodiments of the disclosure may also or alternatively operate on the stream coming from the base band signal generation DL and the stream going to the base band signal processing. These streams may be a combination of one or more antenna streams, in case of beam forming in the radio (mapping N antennas to/from M streams, where N and M are integers equal to or greater than one).

One proposal according to embodiments of the disclosure is to create a combination of two level of block scaling factors:

One wide block scaling factor, covering many samples
One narrow block scaling factor, covering only a few samples In addition, embodiments of the disclosure relate to the creation of an algorithm for adjusting the block scaling factor at a slower pace, so that application of the factor in the core signal processing functions is not needed. This is applicable in UL.

In addition, embodiments of the disclosure relate to the use of the same block scaling factor for samples from different antennas, so that application of the factor is not needed in the core signal processing looking at samples from multiple antennas. This is applicable in UL.

There are, proposed herein, various embodiments which address one or more of the issues disclosed herein. One aspect provides a method performed by a first component part of a base station. The first component part comprises one of a central unit and a radio unit. The base station further comprises a second component part, which comprises the other of the central unit and the radio unit. The method comprises: receiving a user data stream to be transmitted to the second component part, the user data stream comprising a plurality of data samples which are for transmission by the base station over an air interface, or which have been received by the base station over the air interface; applying first and second scaling factors to the data samples to generate a scaled user data stream, wherein the first scaling factor is updateable every first plurality of data samples, wherein the second scaling factor is updateable every second plurality of data samples, and wherein the second plurality of data samples is less than the first plurality of data samples; and transmitting the scaled user data stream and an indication of the first and second scaling factors to the second component part.

Certain embodiments may provide one or more of the following technical advantage(s). For example, embodiments may provide for a reduction in bit rate over the fronthaul interface.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

Figure 1:
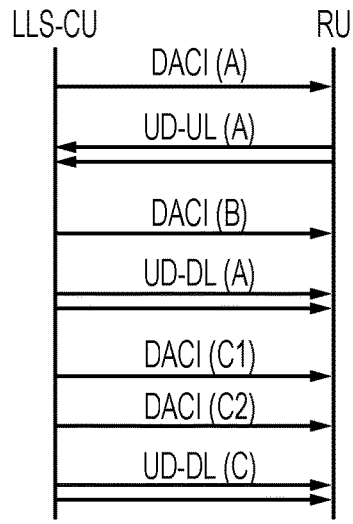
FIG. 1 shows a signalling diagram.
Figure 2:
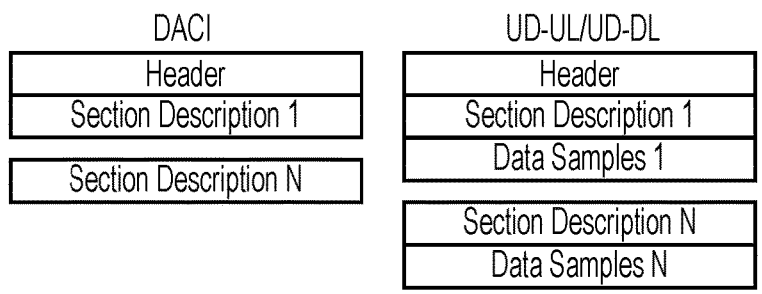
FIG. 2 is a schematic drawing showing DACI and UD-UL/UD-DL messages.
Figure 3:
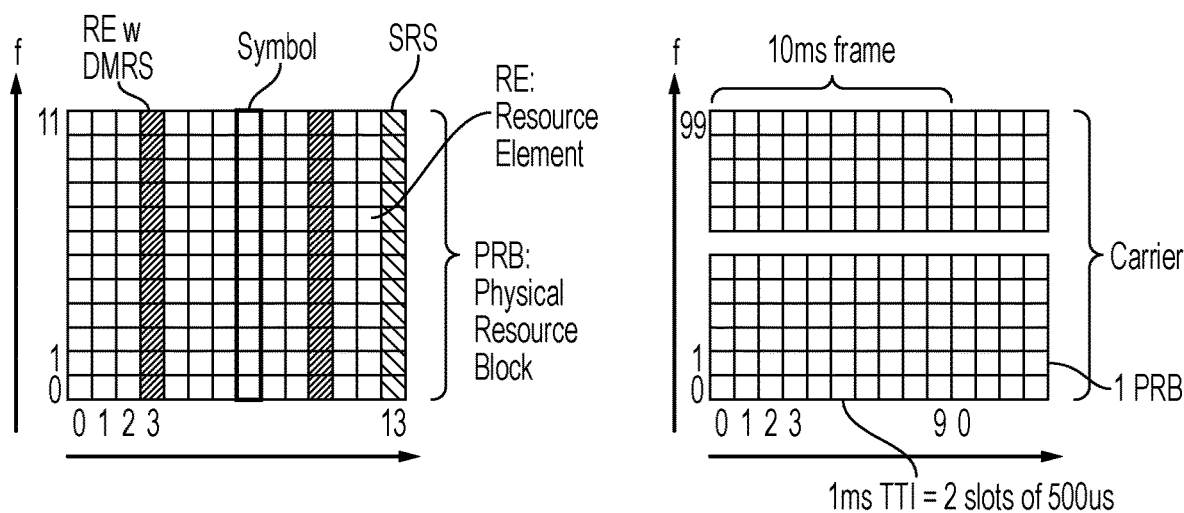
FIG. 3 shows the LTE air interface in the uplink.

FIG. 3 shows the LTE air interface in the UL, for a 20 MHz carrier. Those skilled in the art will appreciate that the principles described herein are equally applicable to New Radio, for example. To the left, a single PRB is shown for 1 TTI, i.e. 12 subcarriers and 14 symbol times. Each box represents a Resource Element, RE, i.e. one subcarrier during one symbol time. Demodulation reference signals (DMRS) are transmitted in symbols 3 and 10, across all subcarriers. A sounding reference signal is transmitted in symbol 13.

To the right, a 20 MHz carrier is shown, i.e. 100 PRBs per TTI. One slot is half a TTI. The fronthaul network carries one value of in-phase (I) and one value of quadrature-phase (Q) value per RE (at least for the occupied REs).

According to embodiments of the disclosure, user data which is to be transmitted between a CU and an RU (e.g., via one or more UD-UL or UD-DL messages) is subjected to a first scaling factor (which may be termed a wide block scaling factor herein) and a second scaling factor (which may be termed a narrow block scaling factor herein). The first scaling factor is updateable every first plurality of data samples, while the second scaling factor is updateable every second plurality of data samples. The second plurality of data samples is less than the first plurality of data samples, such that the second scaling factor may be updated more often than the first scaling factor. In other words, the first scaling factor applies to more data samples than the second scaling factor.

Thus embodiments of the disclosure relate to transmissions between first and second component parts of a network node or base station. As used herein, the first component part is the transmitting node (i.e. the CU for DL data, the RU for UL data) and the second component part is the receiving node (i.e. the RU for DL data, the CU for DL data). Thus embodiments of the disclosure may be implemented in the CU or the RU of a base station, for user data which is transmitted in DL and UL, respectively.

Figure 4:
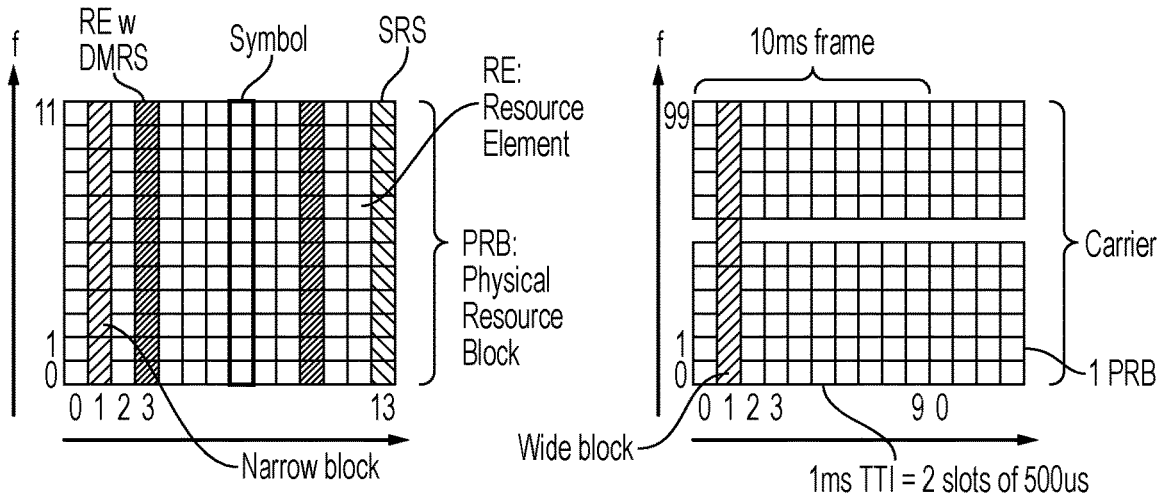
FIG. 4 shows the application of two levels of block scaling according to embodiments of the disclosure.

FIG. 4 shows an example of the two levels of block scaling, with a narrow block (on the left side of the figure) covering two adjacent REs in the frequency domain and a wide block (on the right side of the figure) covering a set of PRBs in the frequency domain. The narrow block is shown for symbol 1, but in general narrow block scaling may be applied to any symbols of a TTI.

According to embodiments of the disclosure, the first component part may compute or determine the appropriate wide and narrow block size (i.e. the number of data samples to which the wide and narrow scaling factors are to be applied), and send the two scaling values (either as scaling factors or scaling exponents) together with the unique data values (after scaling) to the decompressor in the second component part. The benefit of the two-stage block compression is that the narrow block scaling can be selected to have a lower total dynamic range, as the signal entering it is already scaled adaptively (based on the wide block scaling). This reduces the amount of bits necessary in the narrow block scaling factor, which otherwise would need to be repeated for every narrow block.

To reduce the amount of signaling further, the block sizes can be predefined, so the number of scaling factors are known. An example can be narrow block size of 2 or 4 and wide block size corresponding to 1/N of the total amount of REs, e.g. whole carrier (N=1) or half the carrier (N=2).

Another wide block size is the same as a PRB span of a Section, giving one wide block scaling number per section. Alternatively, the wide block size may utilize time resources of a single slot (e.g. half a TTI or PRB).

Figure 5:
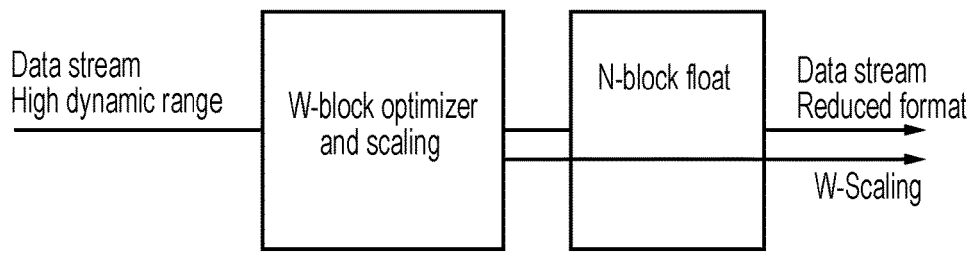
FIG. 5 shows a compression mechanism according to embodiments of the disclosure.

In another embodiment, the amount of signaling between the first and second component parts may be further reduced by changing the wide block scaling factor when needed. A filtering function may then be used to reduce the rate of changes of the wide block scaling factor. This is shown in FIG. 5: A wide block optimizer determines when it is necessary to change the wide block scaling factor, and a N-block float block compresses the narrow blocks. In the examples below, as the name indicates, it is assumed that the narrow block uses a common exponent as a $2^{exponent}$ scaling factor.

The work of the W-block optimizer is to maintain the dynamic range of the samples leaving it within a range suitable for the N-block compression. When the signal level is increasing, the wide block scale factor is changed. This of course impacts the quantization noise of the narrow block format, but the desired SNR is kept. When the signal is low enough, the quantization noise is below the average noise floor.

As indicated in the figure, the rate of the W-block optimizer scaling value change can be different when the wide block scaling factor is rising and falling. Such an embodiment may find particular utility when mitigating interference coming into the cell: if a rapid signal rise if found, the W-block optimizer changes the scaling quickly, but when it is no longer seen, the W-block optimizer keep the scaling the same for a while, to be prepared if the interfering signal returns. For instance, a GSM interferer may return every 4.7 ms, so reductions in the wide block scaling factor may be slower than that. For example, the W-block optimizer may implement a wait-and-see period, i.e. holding the scaling factor at a high level for a period of time (after the signal has risen) before reducing it again. The corresponding raise time can be much quicker.

The link adaptation in the base station can compensate during the wait-and-see period by requesting the UE or wireless device to transmit with higher power.

In a further embodiment of the disclosure, the W-block optimizer is permitted to change values only on slot borders or TTI borders. This allows the core part of the UL signal processing such as the channel estimation and equalization to assume a constant W-block scaling throughout the slot or TTI, and thus reduces the computations. It also reduces the number of times the W-block scaling factor needs to be transferred between the first and second component parts.

In another embodiment of the disclosure, the W-block optimizer may be required to change or be updated simultaneously on all receive data streams. This allows the core part of the UL signal processing to assume a constant relation between the sample values and the signal power at the antenna between different samples from different antennas. This reduces computations or simplifies the algorithms and hardware of the UL signal processing and the numerical quantization becomes predictable.

In the DL, there is no need to have an adaptable W-block scale factor as it is determined already when the TTI is scheduled. The scaling value can be updated on TTI level if needed, or stay the same if the narrow block format allows for it.

Figure 7:
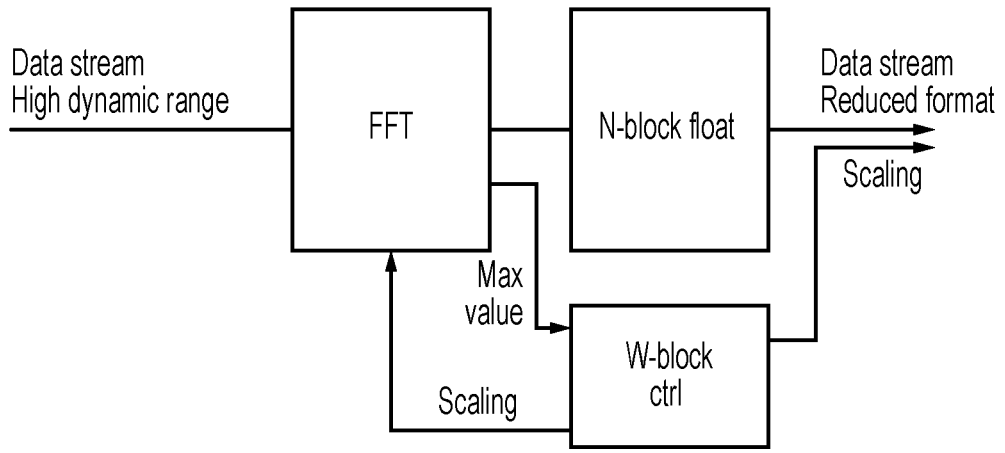
FIG. 7 shows a compression mechanism according to further embodiments of the disclosure.

FIG. 7 shows an exemplary implementation where the W-block scaling is integrated in a fast Fourier transform (FFT) block in the UL. The FFT block is fed with a high dynamic range signal, corresponding to one carrier, parts of a carrier (a subband) or a set of carriers. The FFT block outputs a maximum signal value corresponding to the largest signal sample in the FFT. The W-block control determines a suitable scaling value to be used by the N-block float as a prescalar. Alternatively, the scaling value is input to the FFT as a post processing before sending the samples to the N-block float. The N-block float implements the second scaling factor (narrow block scaling factor).

Figure 8:
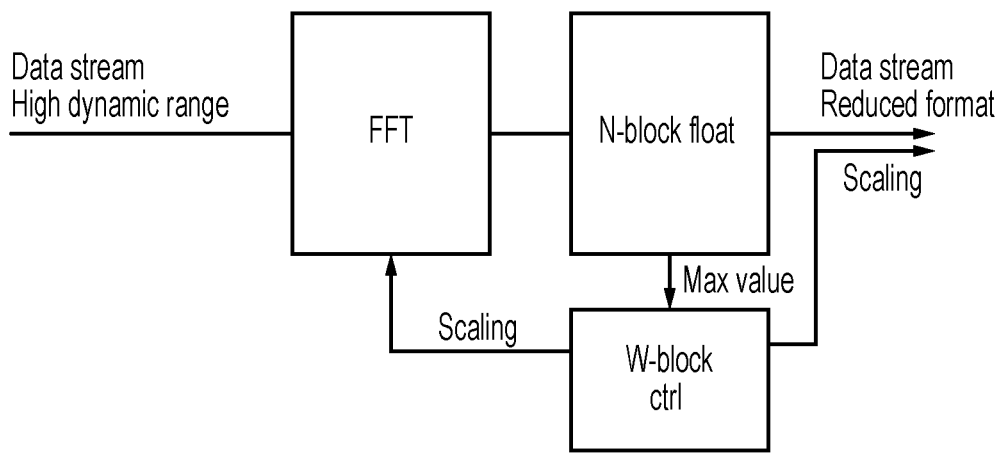
FIG. 8 shows a compression mechanism according to yet further embodiments of the disclosure.

An alternative solution is shown in FIG. 8, where the N-block calculates the max value from the FFT and the W-block sends the scaling to the FFT.

Figure 9:
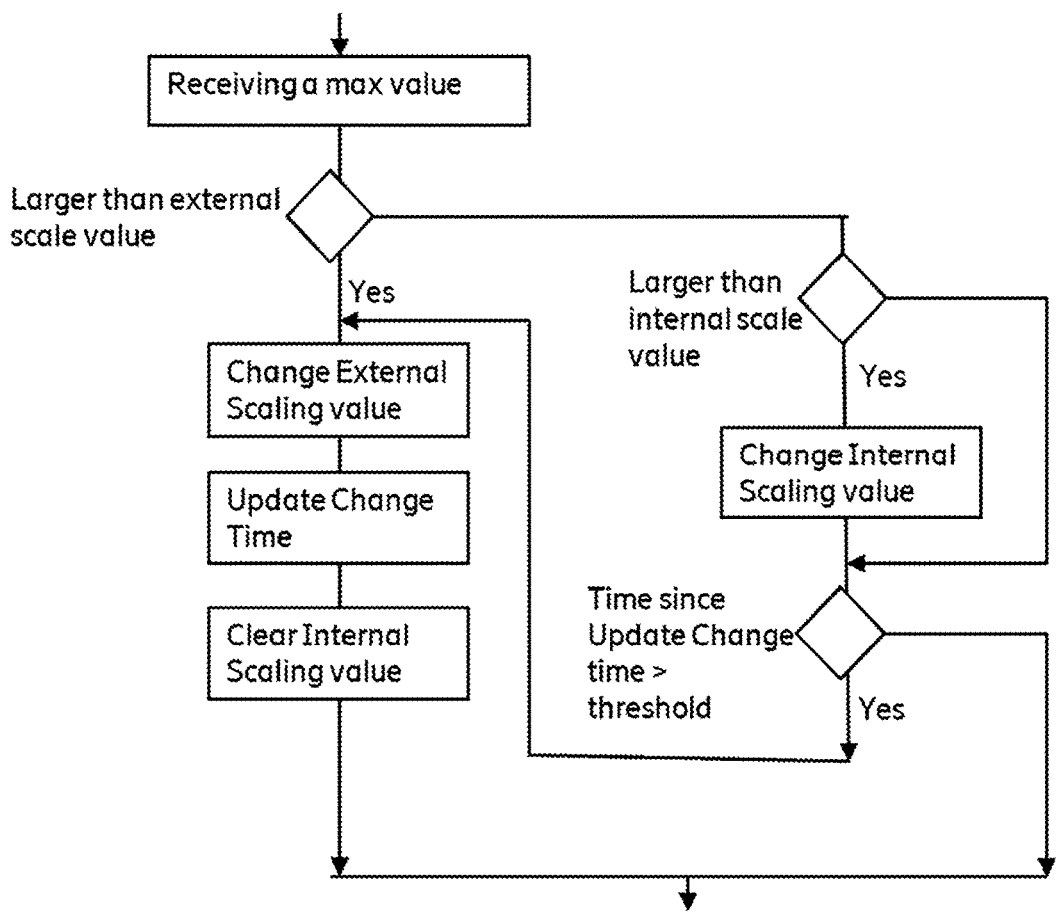
FIG. 9 is a flowchart showing an algorithm according to embodiments of the disclosure.

FIG. 9 shows a simple flow diagram of a W-block control for UL. It receives the maximum value or values for a symbol time, e.g. from the FFT block in FIG. 7. The W-block control determines if this is higher than the current highest value it is tuned for (i.e. the maximum value is greater than upper limit of the dynamic range provided by application of the current first scaling factor). If so, the scaling value is determined to be changed (e.g. increased). The actual change is preferably done at slot or TTI borders to minimize the signaling and the processing need in the receiving end (UL signal processing). When updating the external scaling value, the time of change is stored and the internal filter is reset. If the maximum value is not above the upper limit of the dynamic range supported by the current first scaling value, the filter evaluates if the scaling factor can be lowered. A filter in the W-block (e.g. the same filter which is reset upon increasing the first scaling factor as described above) maintains a dummy (internal) value for the first scaling factor, which is the highest suitable scaling value since the external (used) scaling value was changed. After a threshold period of time (e.g., 20 ms) has lapsed since the external scaling value was last changed, the used scaling value can be replaced with the dummy value (which will be lower than the used value).

Figure 10:
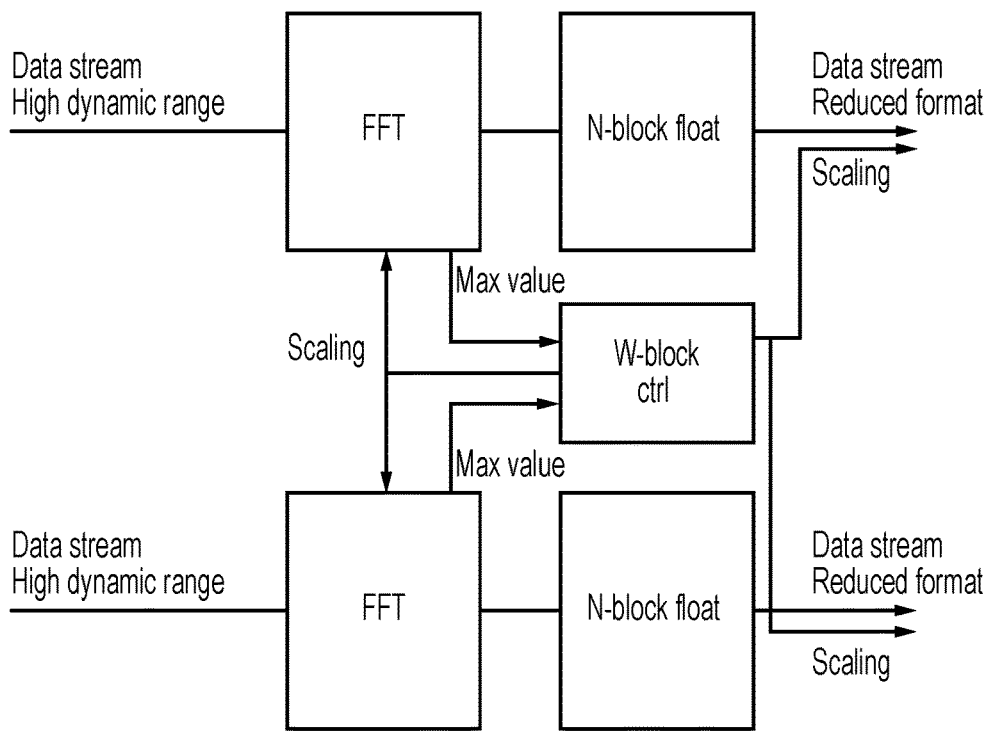
FIG. 10 shows a compression mechanism according to multi-antenna embodiments of the disclosure.

FIG. 10 shows a multi-antenna application of embodiments of the disclosure. The W-block ctrl receives inputs of the maximum values from multiple FFTs, which may operate on the same spectrum part, but on different antennas. Those skilled in the art will appreciate that the multiple FFT blocks may be implemented as the same (i.e. a single) physical hardware. The same scaling value is sent to each of the FFTs. This gives the same range of samples for both branches, and simplifies the UL signal processing range management, as described before FIG. 11 shows an alternative solution where multi-antenna processing is carried out at higher dynamic range than used on the fronthaul interface. The maximum value is received from the N-block float to benefit from any interference suppression done by a Beam Forming block or module (Beam Former). The scaling is sent to the FFT for scaling values to fit the range of the N-block float. The FFT can still output more bits for the unique values, allowing the Beam Former to work on higher resolution. Finally, the beam former output samples are truncated to fewer bits in the N-block float. Alternatively, the N-block float can also do the application of the scaling.

If the beam former is capable of port reduction (e.g. MRC or other suitable scheme), constant W-block scaling allows reduced computational complexity since samples from all antennas have the same W-block scale factor and can be added/subtracted after multiplication by beam weights. If different antennas have different W-block scale factors, the data samples may be converted to a datatype with higher precision before combining the antenna streams.

The above advantage would be applicable both if the port reduction happens between FFT and N-block float conversion, or if the port reduction is done in the LLS-CU, after converting back from N-block float to W-block float.

Figures 11, 12:
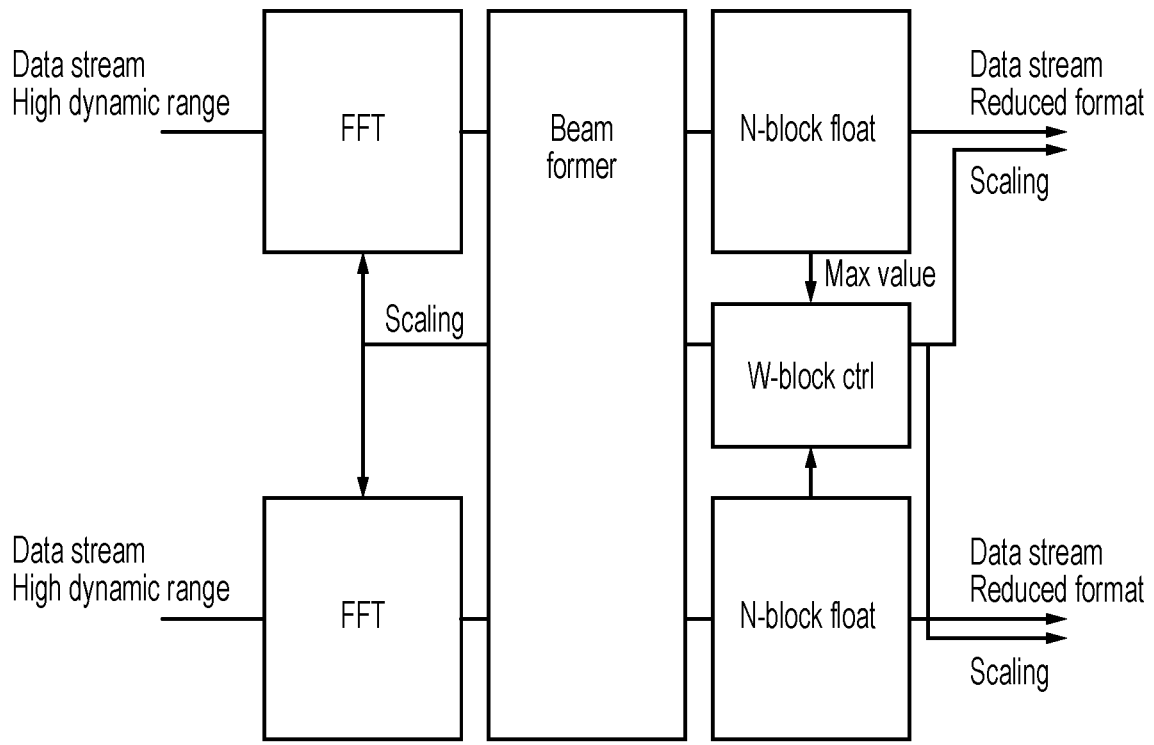
FIG. 11 shows a compression mechanism according to further multi-antenna embodiments of the disclosure.
FIG. 12 shows the format of a data message according to embodiments of the disclosure.

FIG. 12 shows the format of a data message (e.g. a UD-UL or UD-DL message) transmitted from the first component part to the second component part, according to one embodiment. In the particular illustrated embodiment, the packet comprises data for two REs: I and Q values for each RE, as well as a common exponent (e.g., the second scaling factor as applied to those I and Q values). In the particular example, the block comprises 32 bits (4 Bytes).

In one particular embodiment, the wide block size (i.e. the first plurality of data samples) comprises 100 PRBs (one carrier) or the section size, while the narrow block size (i.e. the second plurality of data samples) comprises 2 REs or a complete PRB. A 7-bit mantissa format may be used for the narrow block unique samples, a 4-bit exponent factor may be used for the narrow block scaling factor (i.e. the second scaling factor) and a 4-bit exponent factor may be used for the wide block scaling factor (i.e., the first scaling factor).

In another particular embodiment, five bits may be used for the unique values, and four bits for the exponent, creating a 24 bit block (3 Byte).

The data may be transmitted using the compression fields in the UD-UL and UD-DL messages.

In a first embodiment, the format may be fixed with 7 bit mantissa (for the unique samples), 4 bit exponent, and 2 REs in the narrow block. A 4 bit wide scaling factor exponent can then be fitted in the udIqWidth field and the compression indicated as a new value in the udCompMeth field.

In a second embodiment, the format may be variable, and add this as a regular compression method. A complementary field in the Compression Header may then be used to indicate the wide block scaling factor and the format. The udIqWidth can be used to indicate the mantissa length, and a new field is added to state the scaling factor and scaling format. The usage of the method is added as a value in the udCompMeth field. The new fields can be put either in the udCompHdr reserved byte or in the udCompParam byte.

In a third embodiment, the format may comprise 7 bit mantissa for the unique values (e.g., I and Q values for two REs) and the second scaling factor as a 4 bit exponent. A separate message may then be used to indicate the wide block scaling factor, which may be transmitted only when the wide block scaling value changes. Since this is relatively infrequent, and not necessary for proper decoding of the data, it can be transferred over a non-real-time link, e.g. the management plane. The usage of the Compression header fields are then arbitrary, but for clarity the udCompMeth should indicate the new method, and the udIqWidth could be set to 8 bits samples.

Figure 13:
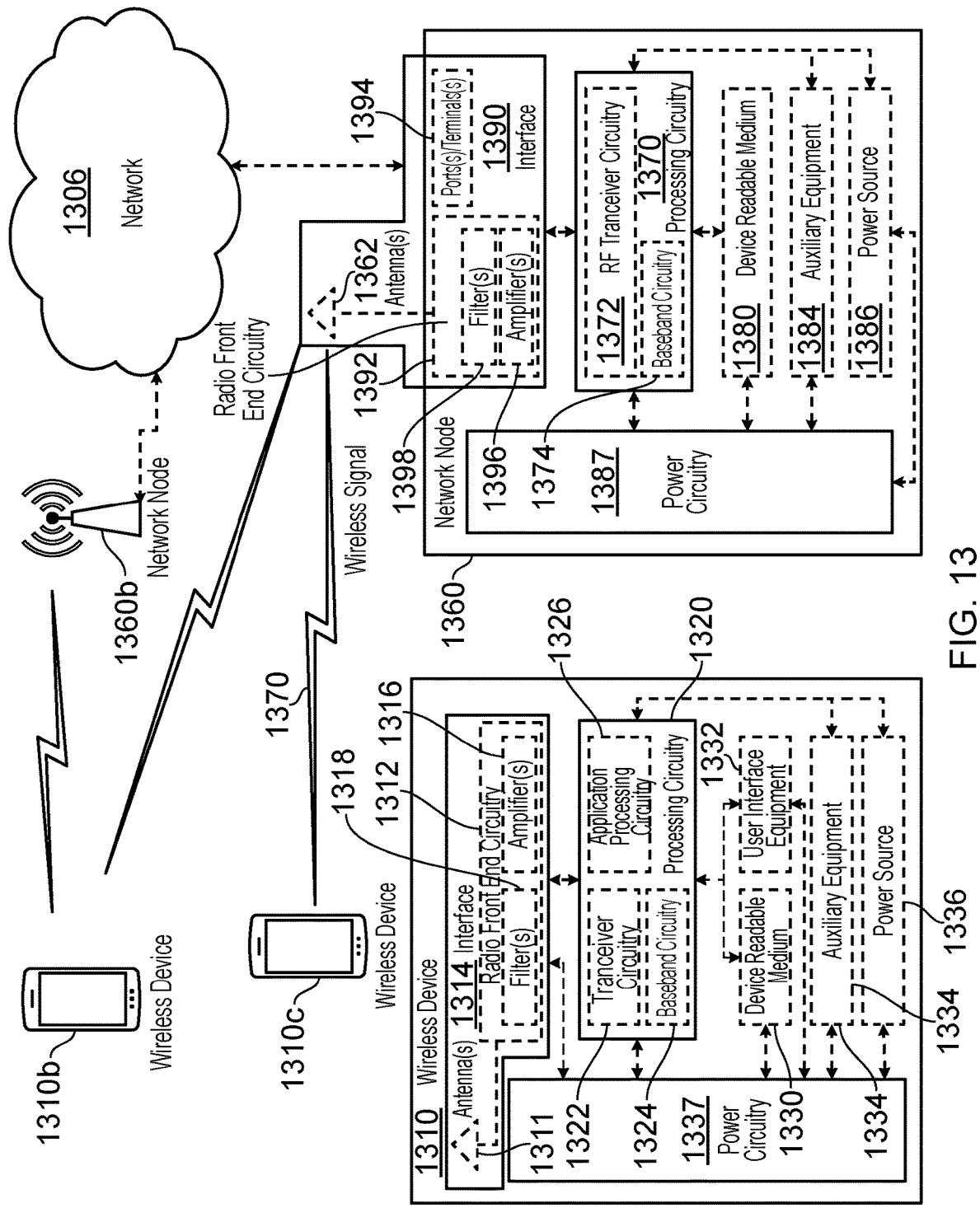
FIG. 13 shows a wireless network according to embodiments of the disclosure.

Although the subject matter described herein may be implemented in any appropriate type of system using any suitable components, the embodiments disclosed herein are described in relation to a wireless network, such as the example wireless network illustrated in FIG. 13. For simplicity, the wireless network of FIG. 13 only depicts network 1306, network nodes 1360 and 1360b, and WDs 1310, 1310b, and 1310c. In practice, a wireless network may further include any additional elements suitable to support communication between wireless devices or between a wireless device and another communication device, such as a landline telephone, a service provider, or any other network node or end device. Of the illustrated components, network node 1360 and wireless device (WD) 1310 are depicted with additional detail. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network 1306 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node 1360 and WD 1310 comprise various components described in more detail below. These components work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs) and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 13, network node 1360 includes processing circuitry 1370, device readable medium 1380, interface 1390, auxiliary equipment 1384, power source 1386, power circuitry 1387, and antenna 1362. Although network node 1360 illustrated in the example wireless network of FIG. 13 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node 1360 are depicted as single boxes located within a larger box, or nested within multiple boxes, in practice, a network node may comprise multiple different physical components that make up a single illustrated component (e.g., device readable medium 1380 may comprise multiple separate hard drives as well as multiple RAM modules).

Similarly, network node 1360 may be composed of multiple physically separate components (e.g., a NodeB component and a RNC component, or a BTS component and a BSC component, etc.), which may each have their own respective components. In certain scenarios in which network node 1360 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node 1360 may be configured to support multiple radio access technologies (RATs). In such embodiments, some components may be duplicated (e.g., separate device readable medium 1380 for the different RATs) and some components may be reused (e.g., the same antenna 1362 may be shared by the RATs). Network node 1360 may also include multiple sets of the various illustrated components for different wireless technologies integrated into network node 1360, such as, for example, GSM, WCDMA, LTE, NR, WiFi, or Bluetooth wireless technologies. These wireless technologies may be integrated into the same or different chip or set of chips and other components within network node 1360.

Processing circuitry 1370 is configured to perform any determining, calculating, or similar operations (e.g., certain obtaining operations) described herein as being provided by a network node. These operations performed by processing circuitry 1370 may include processing information obtained by processing circuitry 1370 by, for example, converting the obtained information into other information, comparing the obtained information or converted information to information stored in the network node, and/or performing one or more operations based on the obtained information or converted information, and as a result of said processing making a determination.

Processing circuitry 1370 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node 1360 components, such as device readable medium 1380, network node 1360 functionality. For example, processing circuitry 1370 may execute instructions stored in device readable medium 1380 or in memory within processing circuitry 1370. Such functionality may include providing any of the various wireless features, functions, or benefits discussed herein. In some embodiments, processing circuitry 1370 may include a system on a chip (SOC).

In some embodiments, processing circuitry 1370 may include one or more of radio frequency (RF) transceiver circuitry 1372 and baseband processing circuitry 1374. In some embodiments, radio frequency (RF) transceiver circuitry 1372 and baseband processing circuitry 1374 may be on separate chips (or sets of chips), boards, or units, such as radio units and digital units. In alternative embodiments, part or all of RF transceiver circuitry 1372 and baseband processing circuitry 1374 may be on the same chip or set of chips, boards, or units In certain embodiments, some or all of the functionality described herein as being provided by a network node, base station, eNB or other such network device may be performed by processing circuitry 1370 executing instructions stored on device readable medium 1380 or memory within processing circuitry 1370. In alternative embodiments, some or all of the functionality may be provided by processing circuitry 1370 without executing instructions stored on a separate or discrete device readable medium, such as in a hard-wired manner. In any of those embodiments, whether executing instructions stored on a device readable storage medium or not, processing circuitry 1370 can be configured to perform the described functionality. The benefits provided by such functionality are not limited to processing circuitry 1370 alone or to other components of network node 1360, but are enjoyed by network node 1360 as a whole, and/or by end users and the wireless network generally.

Device readable medium 1380 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry 1370. Device readable medium 1380 may store any suitable instructions, data or information, including a computer program, software, an application including one or more of logic, rules, code, tables, etc. and/or other instructions capable of being executed by processing circuitry 1370 and, utilized by network node 1360. Device readable medium 1380 may be used to store any calculations made by processing circuitry 1370 and/or any data received via interface 1390. In some embodiments, processing circuitry 1370 and device readable medium 1380 may be considered to be integrated.

Interface 1390 is used in the wired or wireless communication of signalling and/or data between network node 1360, network 1306, and/or WDs 1310. As illustrated, interface 1390 comprises port(s)/terminal(s) 1394 to send and receive data, for example to and from network 1306 over a wired connection. Interface 1390 also includes radio front end circuitry 1392 that may be coupled to, or in certain embodiments a part of, antenna 1362. Radio front end circuitry 1392 comprises filters 1398 and amplifiers 1396. Radio front end circuitry 1392 may be connected to antenna 1362 and processing circuitry 1370. Radio front end circuitry may be configured to condition signals communicated between antenna 1362 and processing circuitry 1370. Radio front end circuitry 1392 may receive digital data that is to be sent out to other network nodes or WDs via a wireless connection. Radio front end circuitry 1392 may convert the digital data into a radio signal having the appropriate channel and bandwidth parameters using a combination of filters 1398 and/or amplifiers 1396. The radio signal may then be transmitted via antenna 1362. Similarly, when receiving data, antenna 1362 may collect radio signals which are then converted into digital data by radio front end circuitry 1392. The digital data may be passed to processing circuitry 1370. In other embodiments, the interface may comprise different components and/or different combinations of components.

In certain alternative embodiments, network node 1360 may not include separate radio front end circuitry 1392, instead, processing circuitry 1370 may comprise radio front end circuitry and may be connected to antenna 1362 without separate radio front end circuitry 1392. Similarly, in some embodiments, all or some of RF transceiver circuitry 1372 may be considered a part of interface 1390. In still other embodiments, interface 1390 may include one or more ports or terminals 1394, radio front end circuitry 1392, and RF transceiver circuitry 1372, as part of a radio unit (not shown), and interface 1390 may communicate with baseband processing circuitry 1374, which is part of a digital unit (not shown).

Antenna 1362 may include one or more antennas, or antenna arrays, configured to send and/or receive wireless signals. Antenna 1362 may be coupled to radio front end circuitry 1390 and may be any type of antenna capable of transmitting and receiving data and/or signals wirelessly. In some embodiments, antenna 1362 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna 1362 may be separate from network node 1360 and may be connectable to network node 1360 through an interface or port.

Antenna 1362, interface 1390, and/or processing circuitry 1370 may be configured to perform any receiving operations and/or certain obtaining operations described herein as being performed by a network node. Any information, data and/or signals may be received from a wireless device, another network node and/or any other network equipment. Similarly, antenna 1362, interface 1390, and/or processing circuitry 1370 may be configured to perform any transmitting operations described herein as being performed by a network node. Any information, data and/or signals may be transmitted to a wireless device, another network node and/or any other network equipment.

Power circuitry 1387 may comprise, or be coupled to, power management circuitry and is configured to supply the components of network node 1360 with power for performing the functionality described herein. Power circuitry 1387 may receive power from power source 1386. Power source 1386 and/or power circuitry 1387 may be configured to provide power to the various components of network node 1360 in a form suitable for the respective components (e.g., at a voltage and current level needed for each respective component). Power source 1386 may either be included in, or external to, power circuitry 1387 and/or network node 1360. For example, network node 1360 may be connectable to an external power source (e.g., an electricity outlet) via an input circuitry or interface such as an electrical cable, whereby the external power source supplies power to power circuitry 1387. As a further example, power source 1386 may comprise a source of power in the form of a battery or battery pack which is connected to, or integrated in, power circuitry 1387. The battery may provide backup power should the external power source fail. Other types of power sources, such as photovoltaic devices, may also be used.

Alternative embodiments of network node 1360 may include additional components beyond those shown in FIG. 13 that may be responsible for providing certain aspects of the network node's functionality, including any of the functionality described herein and/or any functionality necessary to support the subject matter described herein. For example, network node 1360 may include user interface equipment to allow input of information into network node 1360 and to allow output of information from network node 1360. This may allow a user to perform diagnostic, maintenance, repair, and other administrative functions for network node 1360.

According to embodiments of the disclosure, and as noted above, network node 1360 is implemented into at least two component parts: a central unit (CU), such as a LLS-CU; and one or more radio units (RUs). The CU and RU communicate with each other via a fronthaul network or interface, and particularly transmit user data messages or packets to each other over that fronthaul interface, either for transmission from the network node in the DL (i.e. from the CU to the RU) or which have been received by the network node 1360 in the UL (i.e., from the RU to the CU).

The CU and the RU may each comprise processing circuitry which is configured to perform any of the methods described herein, such as those described above with respect to FIG. 9, and below with respect to FIG. 22. The CU and/or RU may further comprise power supply circuitry configured to supply power to the respective CU and RU. The CU and/or RU may further comprise or implement any of the processing blocks and modules described above with respect to FIGS. 5, 7, 8, 10 and 11.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE), a vehicle-mounted wireless terminal device, etc. A WD may support device-to-device (D2D) communication, for example by implementing a 3GPP standard for sidelink communication, vehicle-to-vehicle (V2V), vehicle-to-infrastructure (V2I), vehicle-to-everything (V2X) and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as an MTC device. As one particular example, the WD may be a UE implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device 1310 includes antenna 1311, interface 1314, processing circuitry 1320, device readable medium 1330, user interface equipment 1332, auxiliary equipment 1334, power source 1336 and power circuitry 1337. WD 1310 may include multiple sets of one or more of the illustrated components for different wireless technologies supported by WD 1310, such as, for example, GSM, WCDMA, LTE, NR, WiFi, WiMAX, or Bluetooth wireless technologies, just to mention a few. These wireless technologies may be integrated into the same or different chips or set of chips as other components within WD 1310.

Antenna 1311 may include one or more antennas or antenna arrays, configured to send and/or receive wireless signals, and is connected to interface 1314. In certain alternative embodiments, antenna 1311 may be separate from WD 1310 and be connectable to WD 1310 through an interface or port. Antenna 1311, interface 1314, and/or processing circuitry 1320 may be configured to perform any receiving or transmitting operations described herein as being performed by a WD. Any information, data and/or signals may be received from a network node and/or another WD. In some embodiments, radio front end circuitry and/or antenna 1311 may be considered an interface.

As illustrated, interface 1314 comprises radio front end circuitry 1312 and antenna 1311. Radio front end circuitry 1312 comprise one or more filters 1318 and amplifiers 1316. Radio front end circuitry 1314 is connected to antenna 1311 and processing circuitry 1320, and is configured to condition signals communicated between antenna 1311 and processing circuitry 1320. Radio front end circuitry 1312 may be coupled to or a part of antenna 1311. In some embodiments, WD 1310 may not include separate radio front end circuitry 1312; rather, processing circuitry 1320 may comprise radio front end circuitry and may be connected to antenna 1311. Similarly, in some embodiments, some or all of RF transceiver circuitry 1322 may be considered a part of interface 1314. Radio front end circuitry 1312 may receive digital data that is to be sent out to other network nodes or WDs via a wireless connection. Radio front end circuitry 1312 may convert the digital data into a radio signal having the appropriate channel and bandwidth parameters using a combination of filters 1318 and/or amplifiers 1316. The radio signal may then be transmitted via antenna 1311. Similarly, when receiving data, antenna 1311 may collect radio signals which are then converted into digital data by radio front end circuitry 1312. The digital data may be passed to processing circuitry 1320. In other embodiments, the interface may comprise different components and/or different combinations of components.

Processing circuitry 1320 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD 1310 components, such as device readable medium 1330, WD 1310 functionality. Such functionality may include providing any of the various wireless features or benefits discussed herein. For example, processing circuitry 1320 may execute instructions stored in device readable medium 1330 or in memory within processing circuitry 1320 to provide the functionality disclosed herein.

As illustrated, processing circuitry 1320 includes one or more of RF transceiver circuitry 1322, baseband processing circuitry 1324, and application processing circuitry 1326. In other embodiments, the processing circuitry may comprise different components and/or different combinations of components. In certain embodiments processing circuitry 1320 of WD 1310 may comprise a SOC. In some embodiments, RF transceiver circuitry 1322, baseband processing circuitry 1324, and application processing circuitry 1326 may be on separate chips or sets of chips. In alternative embodiments, part or all of baseband processing circuitry 1324 and application processing circuitry 1326 may be combined into one chip or set of chips, and RF transceiver circuitry 1322 may be on a separate chip or set of chips. In still alternative embodiments, part or all of RF transceiver circuitry 1322 and baseband processing circuitry 1324 may be on the same chip or set of chips, and application processing circuitry 1326 may be on a separate chip or set of chips. In yet other alternative embodiments, part or all of RF transceiver circuitry 1322, baseband processing circuitry 1324, and application processing circuitry 1326 may be combined in the same chip or set of chips. In some embodiments, RF transceiver circuitry 1322 may be a part of interface 1314. RF transceiver circuitry 1322 may condition RF signals for processing circuitry 1320.

In certain embodiments, some or all of the functionality described herein as being performed by a WD may be provided by processing circuitry 1320 executing instructions stored on device readable medium 1330, which in certain embodiments may be a computer-readable storage medium. In alternative embodiments, some or all of the functionality may be provided by processing circuitry 1320 without executing instructions stored on a separate or discrete device readable storage medium, such as in a hard-wired manner. In any of those particular embodiments, whether executing instructions stored on a device readable storage medium or not, processing circuitry 1320 can be configured to perform the described functionality. The benefits provided by such functionality are not limited to processing circuitry 1320 alone or to other components of WD 1310, but are enjoyed by WD 1310 as a whole, and/or by end users and the wireless network generally.

Processing circuitry 1320 may be configured to perform any determining, calculating, or similar operations (e.g., certain obtaining operations) described herein as being performed by a WD. These operations, as performed by processing circuitry 1320, may include processing information obtained by processing circuitry 1320 by, for example, converting the obtained information into other information, comparing the obtained information or converted information to information stored by WD 1310, and/or performing one or more operations based on the obtained information or converted information, and as a result of said processing making a determination.

Device readable medium 1330 may be operable to store a computer program, software, an application including one or more of logic, rules, code, tables, etc. and/or other instructions capable of being executed by processing circuitry 1320. Device readable medium 1330 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry 1320. In some embodiments, processing circuitry 1320 and device readable medium 1330 may be considered to be integrated.

User interface equipment 1332 may provide components that allow for a human user to interact with WD 1310. Such interaction may be of many forms, such as visual, audial, tactile, etc. User interface equipment 1332 may be operable to produce output to the user and to allow the user to provide input to WD 1310. The type of interaction may vary depending on the type of user interface equipment 1332 installed in WD 1310. For example, if WD 1310 is a smart phone, the interaction may be via a touch screen; if WD 1310 is a smart meter, the interaction may be through a screen that provides usage (e.g., the number of gallons used) or a speaker that provides an audible alert (e.g., if smoke is detected). User interface equipment 1332 may include input interfaces, devices and circuits, and output interfaces, devices and circuits. User interface equipment 1332 is configured to allow input of information into WD 1310, and is connected to processing circuitry 1320 to allow processing circuitry 1320 to process the input information. User interface equipment 1332 may include, for example, a microphone, a proximity or other sensor, keys/buttons, a touch display, one or more cameras, a USB port, or other input circuitry. User interface equipment 1332 is also configured to allow output of information from WD 1310, and to allow processing circuitry 1320 to output information from WD 1310. User interface equipment 1332 may include, for example, a speaker, a display, vibrating circuitry, a USB port, a headphone interface, or other output circuitry. Using one or more input and output interfaces, devices, and circuits, of user interface equipment 1332, WD 1310 may communicate with end users and/or the wireless network, and allow them to benefit from the functionality described herein.

Auxiliary equipment 1334 is operable to provide more specific functionality which may not be generally performed by WDs. This may comprise specialized sensors for doing measurements for various purposes, interfaces for additional types of communication such as wired communications etc. The inclusion and type of components of auxiliary equipment 1334 may vary depending on the embodiment and/or scenario.

Power source 1336 may, in some embodiments, be in the form of a battery or battery pack. Other types of power sources, such as an external power source (e.g., an electricity outlet), photovoltaic devices or power cells, may also be used. WD 1310 may further comprise power circuitry 1337 for delivering power from power source 1336 to the various parts of WD 1310 which need power from power source 1336 to carry out any functionality described or indicated herein. Power circuitry 1337 may in certain embodiments comprise power management circuitry. Power circuitry 1337 may additionally or alternatively be operable to receive power from an external power source; in which case WD 1310 may be connectable to the external power source (such as an electricity outlet) via input circuitry or an interface such as an electrical power cable. Power circuitry 1337 may also in certain embodiments be operable to deliver power from an external power source to power source 1336. This may be, for example, for the charging of power source 1336. Power circuitry 1337 may perform any formatting, converting, or other modification to the power from power source 1336 to make the power suitable for the respective components of WD 1310 to which power is supplied.

Figure 14:
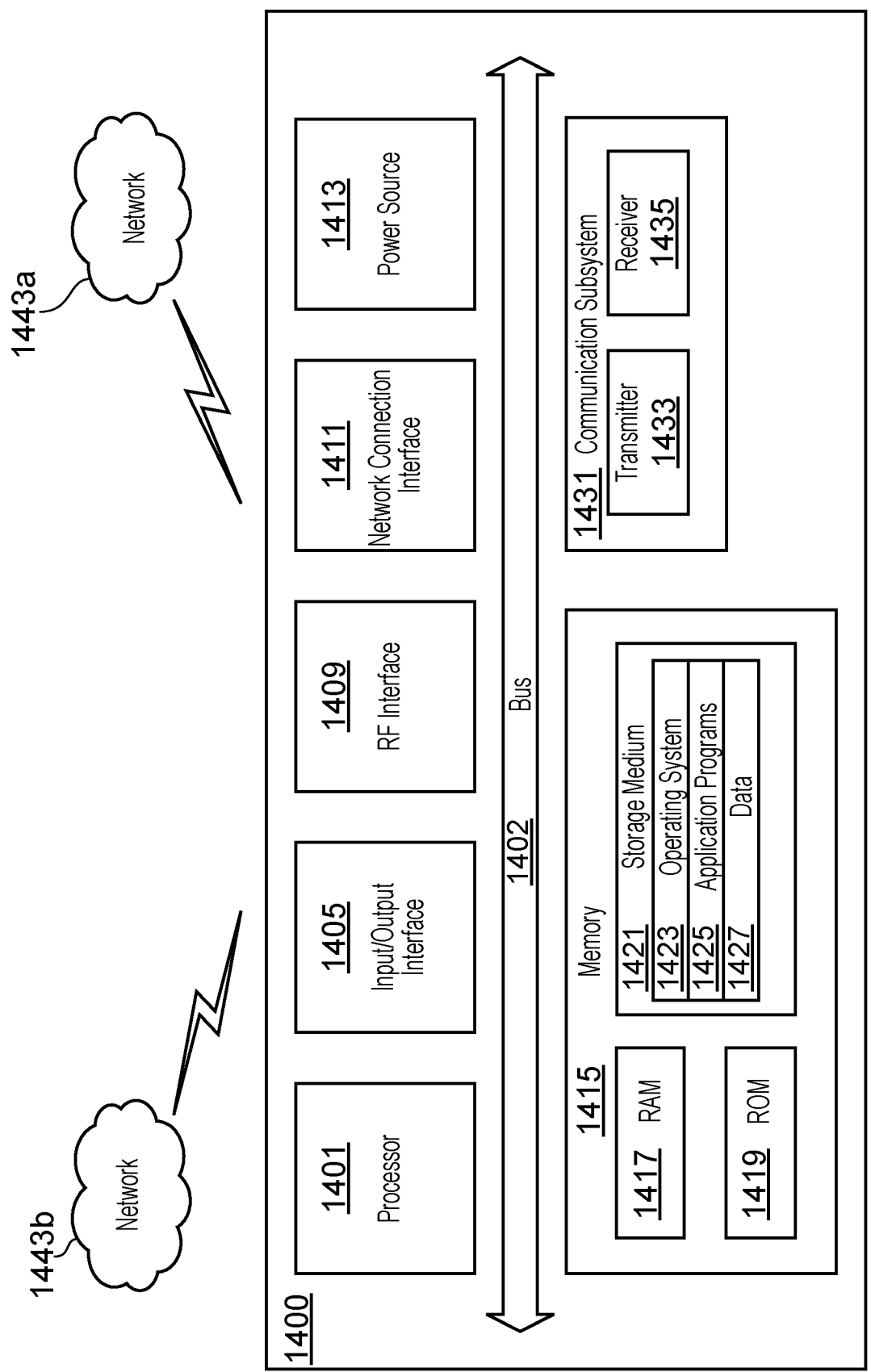
FIG. 14 shows a user equipment according to embodiments of the disclosure.

FIG. 14 illustrates one embodiment of a UE in accordance with various aspects described herein. As used herein, a user equipment or UE may not necessarily have a user in the sense of a human user who owns and/or operates the relevant device. Instead, a UE may represent a device that is intended for sale to, or operation by, a human user but which may not, or which may not initially, be associated with a specific human user (e.g., a smart sprinkler controller). Alternatively, a UE may represent a device that is not intended for sale to, or operation by, an end user but which may be associated with or operated for the benefit of a user (e.g., a smart power meter). UE 14200 may be any UE identified by the $3^{rd}$ Generation Partnership Project (3GPP), including a NB-IoT UE, a machine type communication (MTC) UE, and/or an enhanced MTC (eMTC) UE. UE 1400, as illustrated in FIG. 14, is one example of a WD configured for communication in accordance with one or more communication standards promulgated by the $3^{rd}$ Generation Partnership Project (3GPP), such as 3GPP's GSM, UMTS, LTE, and/or 5G standards. As mentioned previously, the term WD and UE may be used interchangeable. Accordingly, although FIG. 14 is a UE, the components discussed herein are equally applicable to a WD, and vice-versa.

In FIG. 14, UE 1400 includes processing circuitry 1401 that is operatively coupled to input/output interface 1405, radio frequency (RF) interface 1409, network connection interface 1411, memory 1415 including random access memory (RAM) 1417, read-only memory (ROM) 1419, and storage medium 1421 or the like, communication subsystem 1431, power source 1433, and/or any other component, or any combination thereof. Storage medium 1421 includes operating system 1423, application program 1425, and data 1427. In other embodiments, storage medium 1421 may include other similar types of information. Certain UEs may utilize all of the components shown in FIG. 14, or only a subset of the components. The level of integration between the components may vary from one UE to another UE. Further, certain UEs may contain multiple instances of a component, such as multiple processors, memories, transceivers, transmitters, receivers, etc.

In FIG. 14, processing circuitry 1401 may be configured to process computer instructions and data. Processing circuitry 1401 may be configured to implement any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored program, general-purpose processors, such as a microprocessor or Digital Signal Processor (DSP), together with appropriate software; or any combination of the above. For example, the processing circuitry 1401 may include two central processing units (CPUs). Data may be information in a form suitable for use by a computer.

In the depicted embodiment, input/output interface 1405 may be configured to provide a communication interface to an input device, output device, or input and output device. UE 1400 may be configured to use an output device via input/output interface 1405. An output device may use the same type of interface port as an input device. For example, a USB port may be used to provide input to and output from UE 1400. The output device may be a speaker, a sound card, a video card, a display, a monitor, a printer, an actuator, an emitter, a smartcard, another output device, or any combination thereof. UE 1400 may be configured to use an input device via input/output interface 1405 to allow a user to capture information into UE 1400. The input device may include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, another like sensor, or any combination thereof. For example, the input device may be an accelerometer, a magnetometer, a digital camera, a microphone, and an optical sensor.

In FIG. 14, RF interface 1409 may be configured to provide a communication interface to RF components such as a transmitter, a receiver, and an antenna. Network connection interface 1411 may be configured to provide a communication interface to network 1443a. Network 1443a may encompass wired and/or wireless networks such as a local-area network (LAN), a wide-area network (WAN), a computer network, a wireless network, a telecommunications network, another like network or any combination thereof. For example, network 1443a may comprise a Wi-Fi network. Network connection interface 1411 may be configured to include a receiver and a transmitter interface used to communicate with one or more other devices over a communication network according to one or more communication protocols, such as Ethernet, TCP/IP, SONET, ATM, or the like. Network connection interface 1411 may implement receiver and transmitter functionality appropriate to the communication network links (e.g., optical, electrical, and the like). The transmitter and receiver functions may share circuit components, software or firmware, or alternatively may be implemented separately.

RAM 1417 may be configured to interface via bus 1402 to processing circuitry 1401 to provide storage or caching of data or computer instructions during the execution of software programs such as the operating system, application programs, and device drivers. ROM 1419 may be configured to provide computer instructions or data to processing circuitry 1401. For example, ROM 1419 may be configured to store invariant low-level system code or data for basic system functions such as basic input and output (I/O), startup, or reception of keystrokes from a keyboard that are stored in a non-volatile memory. Storage medium 1421 may be configured to include memory such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, or flash drives. In one example, storage medium 1421 may be configured to include operating system 1423, application program 1425 such as a web browser application, a widget or gadget engine or another application, and data file 1427. Storage medium 1421 may store, for use by UE 1400, any of a variety of various operating systems or combinations of operating systems.

Storage medium 1421 may be configured to include a number of physical drive units, such as redundant array of independent disks (RAID), floppy disk drive, flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as a subscriber identity module or a removable user identity (SIM/RUIM) module, other memory, or any combination thereof. Storage medium 1421 may allow UE 1400 to access computer-executable instructions, application programs or the like, stored on transitory or non-transitory memory media, to off-load data, or to upload data. An article of manufacture, such as one utilizing a communication system may be tangibly embodied in storage medium 1421, which may comprise a device readable medium.

In FIG. 14, processing circuitry 1401 may be configured to communicate with network 1443*b* using communication subsystem 1431. Network 1443*a* and network 1443*b* may be the same network or networks or different network or networks. Communication subsystem 1431 may be configured to include one or more transceivers used to communicate with network 1443*b*. For example, communication subsystem 1431 may be configured to include one or more transceivers used to communicate with one or more remote transceivers of another device capable of wireless communication such as another WD, UE, or base station of a radio access network (RAN) according to one or more communication protocols, such as IEEE 802.11, CDMA, WCDMA, GSM, LTE, UTRAN, WiMax, or the like. Each transceiver may include transmitter 1433 and/or receiver 1435 to implement transmitter or receiver functionality, respectively, appropriate to the RAN links (e.g., frequency allocations and the like). Further, transmitter 1433 and receiver 1435 of each transceiver may share circuit components, software or firmware, or alternatively may be implemented separately.

In the illustrated embodiment, the communication functions of communication subsystem 1431 may include data communication, voice communication, multimedia communication, short-range communications such as Bluetooth, near-field communication, location-based communication such as the use of the global positioning system (GPS) to determine a location, another like communication function, or any combination thereof. For example, communication subsystem 1431 may include cellular communication, Wi-Fi communication, Bluetooth communication, and GPS communication. Network 1443*b* may encompass wired and/or wireless networks such as a local-area network (LAN), a wide-area network (WAN), a computer network, a wireless network, a telecommunications network, another like network or any combination thereof. For example, network 1443*b* may be a cellular network, a Wi-Fi network, and/or a near-field network. Power source 1413 may be configured to provide alternating current (AC) or direct current (DC) power to components of UE 1400.

The features, benefits and/or functions described herein may be implemented in one of the components of UE 1400 or partitioned across multiple components of UE 1400. Further, the features, benefits, and/or functions described herein may be implemented in any combination of hardware, software or firmware. In one example, communication subsystem 1431 may be configured to include any of the components described herein. Further, processing circuitry 1401 may be configured to communicate with any of such components over bus 1402. In another example, any of such components may be represented by program instructions stored in memory that when executed by processing circuitry 1401 perform the corresponding functions described herein. In another example, the functionality of any of such components may be partitioned between processing circuitry 1401 and communication subsystem 1431. In another example, the non-computationally intensive functions of any of such components may be implemented in software or firmware and the computationally intensive functions may be implemented in hardware.

Figure 15:
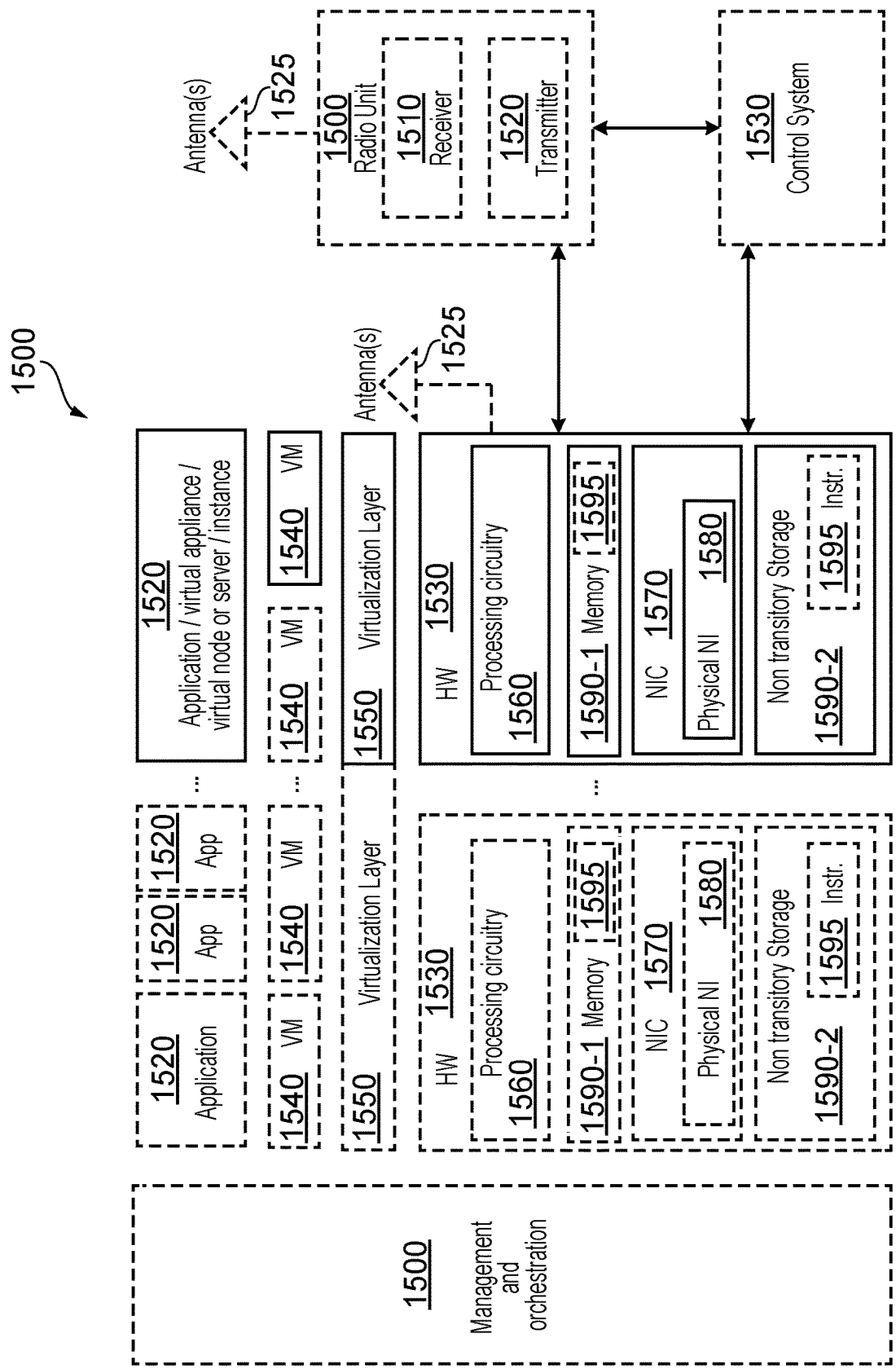
FIG. 15 shows a virtualization environment according to embodiments of the disclosure.

FIG. 15 is a schematic block diagram illustrating a virtualization environment 1500 in which functions implemented by some embodiments may be virtualized. In the present context, virtualizing means creating virtual versions of apparatuses or devices which may include virtualizing hardware platforms, storage devices and networking resources. As used herein, virtualization can be applied to a node (e.g., a virtualized base station or a virtualized radio access node) or to a device (e.g., a UE, a wireless device or any other type of communication device) or components thereof and relates to an implementation in which at least a portion of the functionality is implemented as one or more virtual components (e.g., via one or more applications, components, functions, virtual machines or containers executing on one or more physical processing nodes in one or more networks).

In some embodiments, some or all of the functions described herein may be implemented as virtual components executed by one or more virtual machines implemented in one or more virtual environments 1500 hosted by one or more of hardware nodes 1530. Further, in embodiments in which the virtual node is not a radio access node or does not require radio connectivity (e.g., a core network node), then the network node may be entirely virtualized.

The functions may be implemented by one or more applications 1520 (which may alternatively be called software instances, virtual appliances, network functions, virtual nodes, virtual network functions, etc.) operative to implement some of the features, functions, and/or benefits of some of the embodiments disclosed herein. Applications 1520 are run in virtualization environment 1500 which provides hardware 1530 comprising processing circuitry 1560 and memory 1590. Memory 1590 contains instructions 1595 executable by processing circuitry 1560 whereby application 1520 is operative to provide one or more of the features, benefits, and/or functions disclosed herein.

Virtualization environment 1500, comprises general-purpose or special-purpose network hardware devices 1530 comprising a set of one or more processors or processing circuitry 1560, which may be commercial off-the-shelf (COTS) processors, dedicated Application Specific Integrated Circuits (ASICs), or any other type of processing circuitry including digital or analog hardware components or special purpose processors. Each hardware device may comprise memory 1590-1 which may be non-persistent memory for temporarily storing instructions 1595 or software executed by processing circuitry 1560. Each hardware device may comprise one or more network interface controllers (NICs) 1570, also known as network interface cards, which include physical network interface 1580. Each hardware device may also include non-transitory, persistent, machine-readable storage media 1590-2 having stored therein software 1595 and/or instructions executable by processing circuitry 1560. Software 1595 may include any type of software including software for instantiating one or more virtualization layers 1550 (also referred to as hypervisors), software to execute virtual machines 1540 as well as software allowing it to execute functions, features and/or benefits described in relation with some embodiments described herein.

Virtual machines 1540, comprise virtual processing, virtual memory, virtual networking or interface and virtual storage, and may be run by a corresponding virtualization layer 1550 or hypervisor. Different embodiments of the instance of virtual appliance 1520 may be implemented on one or more of virtual machines 1540, and the implementations may be made in different ways.

During operation, processing circuitry 1560 executes software 1595 to instantiate the hypervisor or virtualization layer 1550, which may sometimes be referred to as a virtual machine monitor (VMM). Virtualization layer 1550 may present a virtual operating platform that appears like networking hardware to virtual machine 1540.

As shown in FIG. 15, hardware 1530 may be a standalone network node with generic or specific components. Hardware 1530 may comprise antenna 15225 and may implement some functions via virtualization. Alternatively, hardware 1530 may be part of a larger cluster of hardware (e.g. such as in a data center or customer premise equipment (CPE)) where many hardware nodes work together and are managed via management and orchestration (MANO) 15100, which, among others, oversees lifecycle management of applications 1520.

Virtualization of the hardware is in some contexts referred to as network function virtualization (NFV). NFV may be used to consolidate many network equipment types onto industry standard high volume server hardware, physical switches, and physical storage, which can be located in data centers, and customer premise equipment.

In the context of NFV, virtual machine 1540 may be a software implementation of a physical machine that runs programs as if they were executing on a physical, non-virtualized machine. Each of virtual machines 1540, and that part of hardware 1530 that executes that virtual machine, be it hardware dedicated to that virtual machine and/or hardware shared by that virtual machine with others of the virtual machines 1540, forms a separate virtual network elements (VNE).

Still in the context of NFV, Virtual Network Function (VNF) is responsible for handling specific network functions that run in one or more virtual machines 1540 on top of hardware networking infrastructure 1530 and corresponds to application 1520 in FIG. 15.

In some embodiments, one or more radio units 15200 that each include one or more transmitters 15220 and one or more receivers 15210 may be coupled to one or more antennas 15225. Radio units 15200 may communicate directly with hardware nodes 1530 via one or more appropriate network interfaces and may be used in combination with the virtual components to provide a virtual node with radio capabilities, such as a radio access node or a base station.

In some embodiments, some signalling can be effected with the use of control system 15230 which may alternatively be used for communication between the hardware nodes 1530 and radio units 15200.

Figure 16:
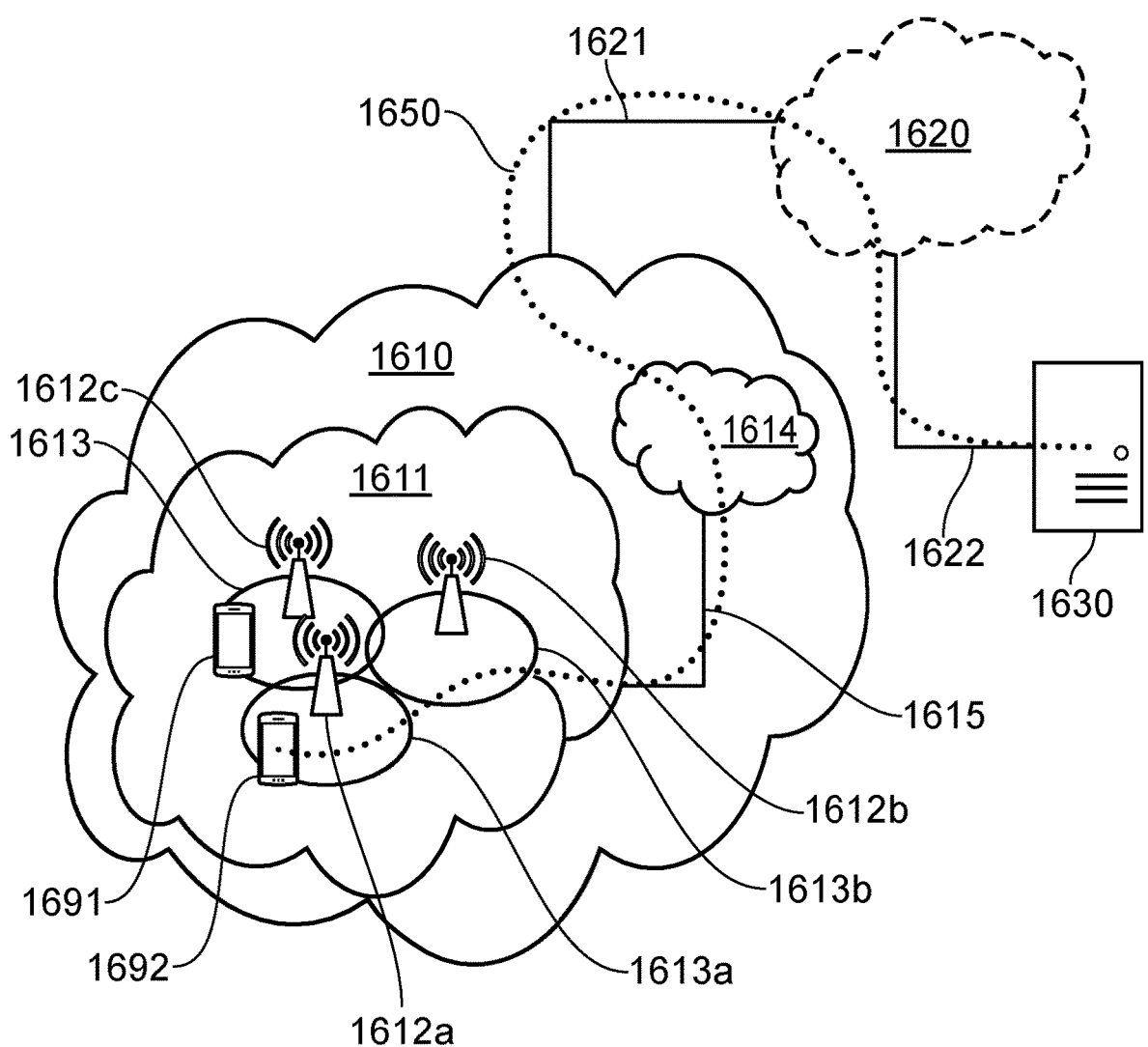
FIG. 16 shows a telecommunication network connected via an intermediate network to a host computer according to embodiments of the disclosure.

With reference to FIG. 16, in accordance with an embodiment, a communication system includes telecommunication network 1610, such as a 3GPP-type cellular network, which comprises access network 1611, such as a radio access network, and core network 1614. Access network 1611 comprises a plurality of base stations 1612a, 1612b, 1612c, such as NBs, eNBs, gNBs or other types of wireless access points, each defining a corresponding coverage area 1613a, 1613b, 1613c. Each base station 1612a, 1612b, 1612c is connectable to core network 1614 over a wired or wireless connection 1615. A first UE 1691 located in coverage area 1613c is configured to wirelessly connect to, or be paged by, the corresponding base station 1612c. A second UE 1692 in coverage area 1613a is wirelessly connectable to the corresponding base station 1612a. While a plurality of UEs 1691, 1692 are illustrated in this example, the disclosed embodiments are equally applicable to a situation where a sole UE is in the coverage area or where a sole UE is connecting to the corresponding base station 1612.

Telecommunication network 1610 is itself connected to host computer 1630, which may be embodied in the hardware and/or software of a standalone server, a cloud-implemented server, a distributed server or as processing resources in a server farm. Host computer 1630 may be under the ownership or control of a service provider, or may be operated by the service provider or on behalf of the service provider. Connections 1621 and 1622 between telecommunication network 1610 and host computer 1630 may extend directly from core network 1614 to host computer 1630 or may go via an optional intermediate network 1620. Intermediate network 1620 may be one of, or a combination of more than one of, a public, private or hosted network; intermediate network 1620, if any, may be a backbone network or the Internet; in particular, intermediate network 1620 may comprise two or more sub-networks (not shown).

The communication system of FIG. 16 as a whole enables connectivity between the connected UEs 1691, 1692 and host computer 1630. The connectivity may be described as an over-the-top (OTT) connection 1650. Host computer 1630 and the connected UEs 1691, 1692 are configured to communicate data and/or signaling via OTT connection 1650, using access network 1611, core network 1614, any intermediate network 1620 and possible further infrastructure (not shown) as intermediaries. OTT connection 1650 may be transparent in the sense that the participating communication devices through which OTT connection 1650 passes are unaware of routing of uplink and downlink communications. For example, base station 1612 may not or need not be informed about the past routing of an incoming downlink communication with data originating from host computer 1630 to be forwarded (e.g., handed over) to a connected UE 1691. Similarly, base station 1612 need not be aware of the future routing of an outgoing uplink communication originating from the UE 1691 towards the host computer 1630.

Example implementations, in accordance with an embodiment, of the UE, base station and host computer discussed in the preceding paragraphs will now be described with reference to FIG. 17. In communication system 1700, host computer 1710 comprises hardware 1715 including communication interface 1716 configured to set up and maintain a wired or wireless connection with an interface of a different communication device of communication system 1700. Host computer 1710 further comprises processing circuitry 1718, which may have storage and/or processing capabilities. In particular, processing circuitry 1718 may comprise one or more programmable processors, application-specific integrated circuits, field programmable gate arrays or combinations of these (not shown) adapted to execute instructions. Host computer 1710 further comprises software 1711, which is stored in or accessible by host computer 1710 and executable by processing circuitry 1718. Software 1711 includes host application 1712. Host application 1712 may be operable to provide a service to a remote user, such as UE 1730 connecting via OTT connection 1750 terminating at UE 1730 and host computer 1710. In providing the service to the remote user, host application 1712 may provide user data which is transmitted using OTT connection 1750.

Communication system 1700 further includes base station 1720 provided in a telecommunication system and comprising hardware 1725 enabling it to communicate with host computer 1710 and with UE 1730. Hardware 1725 may include communication interface 1726 for setting up and maintaining a wired or wireless connection with an interface of a different communication device of communication system 1700, as well as radio interface 1727 for setting up and maintaining at least wireless connection 1770 with UE 1730 located in a coverage area (not shown in FIG. 17) served by base station 1720. Communication interface 1726 may be configured to facilitate connection 1760 to host computer 1710. Connection 1760 may be direct or it may pass through a core network (not shown in FIG. 17) of the telecommunication system and/or through one or more intermediate networks outside the telecommunication system. In the embodiment shown, hardware 1725 of base station 1720 further includes processing circuitry 1728, which may comprise one or more programmable processors, application-specific integrated circuits, field programmable gate arrays or combinations of these (not shown) adapted to execute instructions. Base station 1720 further has software 1721 stored internally or accessible via an external connection.

Communication system 1700 further includes UE 1730 already referred to. Its hardware 1735 may include radio interface 1737 configured to set up and maintain wireless connection 1770 with a base station serving a coverage area in which UE 1730 is currently located. Hardware 1735 of UE 1730 further includes processing circuitry 1738, which may comprise one or more programmable processors, application-specific integrated circuits, field programmable gate arrays or combinations of these (not shown) adapted to execute instructions. UE 1730 further comprises software 1731, which is stored in or accessible by UE 1730 and executable by processing circuitry 1738. Software 1731 includes client application 1732. Client application 1732 may be operable to provide a service to a human or non-human user via UE 1730, with the support of host computer 1710. In host computer 1710, an executing host application 1712 may communicate with the executing client application 1732 via OTT connection 1750 terminating at UE 1730 and host computer 1710. In providing the service to the user, client application 1732 may receive request data from host application 1712 and provide user data in response to the request data. OTT connection 1750 may transfer both the request data and the user data. Client application 1732 may interact with the user to generate the user data that it provides.

Figure 17:
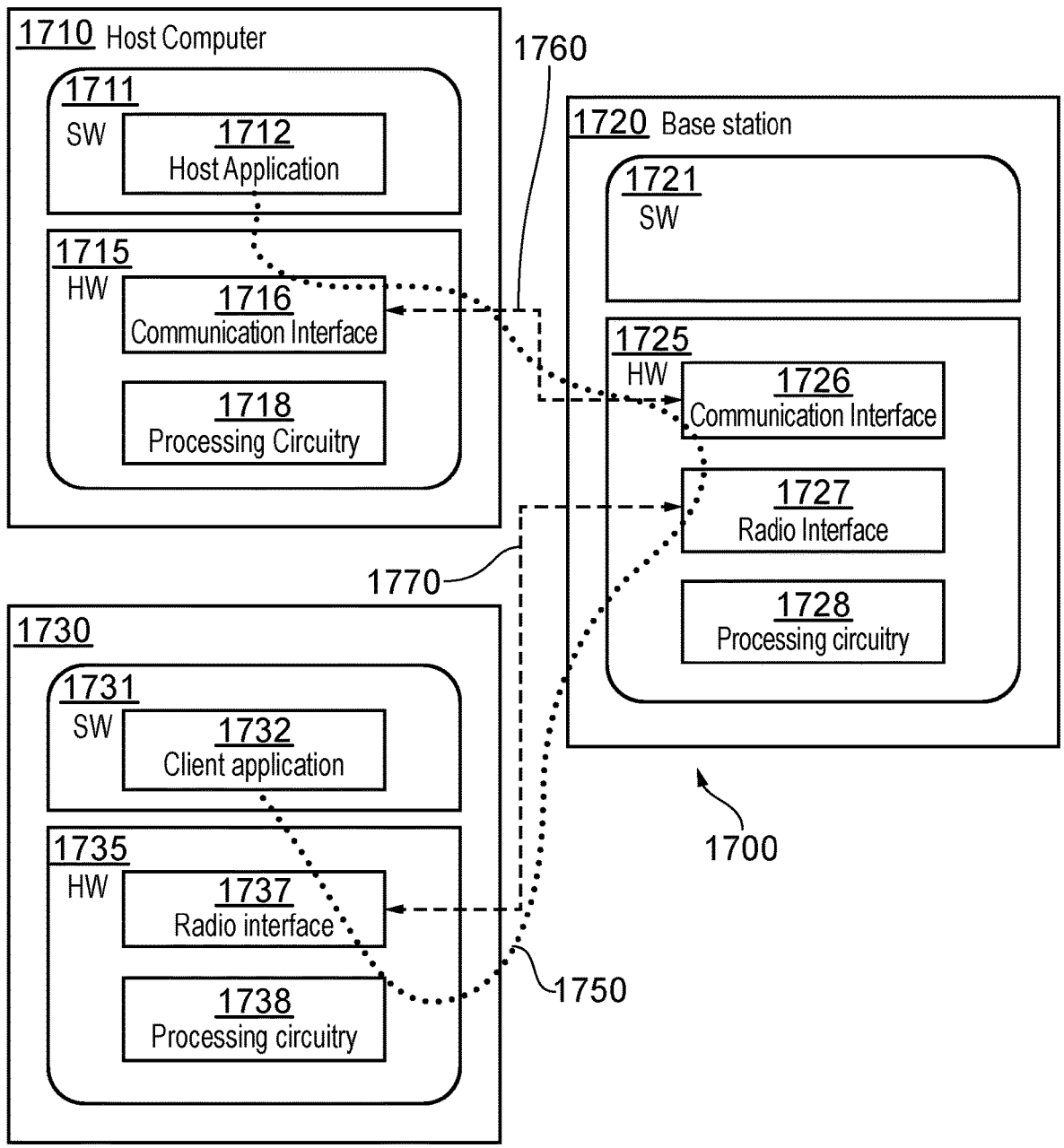
FIG. 17 shows a host computing communicating via a base station with a user equipment over a partially wireless connection according to embodiments of the disclosure.

It is noted that host computer 1710, base station 1720 and UE 1730 illustrated in FIG. 17 may be similar or identical to host computer 1630, one of base stations 1612a, 1612b, 1612c and one of UEs 1691, 1692 of FIG. 16, respectively. This is to say, the inner workings of these entities may be as shown in FIG. 17 and independently, the surrounding network topology may be that of FIG. 16.

In FIG. 17, OTT connection 1750 has been drawn abstractly to illustrate the communication between host computer 1710 and UE 1730 via base station 1720, without explicit reference to any intermediary devices and the precise routing of messages via these devices. Network infrastructure may determine the routing, which it may be configured to hide from UE 1730 or from the service provider operating host computer 1710, or both. While OTT connection 1750 is active, the network infrastructure may further take decisions by which it dynamically changes the routing (e.g., on the basis of load balancing consideration or reconfiguration of the network).

Wireless connection 1770 between UE 1730 and base station 1720 is in accordance with the teachings of the embodiments described throughout this disclosure. One or more of the various embodiments improve the performance of OTT services provided to UE 1730 using OTT connection 1750, in which wireless connection 1770 forms the last segment. More precisely, the teachings of these embodiments may improve the data rate and reduce the latency of user data transmitted to or from a base station and thereby provide benefits such as reduced user waiting time and better responsiveness.

A measurement procedure may be provided for the purpose of monitoring data rate, latency and other factors on which the one or more embodiments improve. There may further be an optional network functionality for reconfiguring OTT connection 1750 between host computer 1710 and UE 1730, in response to variations in the measurement results. The measurement procedure and/or the network functionality for reconfiguring OTT connection 1750 may be implemented in software 1711 and hardware 1715 of host computer 1710 or in software 1731 and hardware 1735 of UE 1730, or both. In embodiments, sensors (not shown) may be deployed in or in association with communication devices through which OTT connection 1750 passes; the sensors may participate in the measurement procedure by supplying values of the monitored quantities exemplified above, or supplying values of other physical quantities from which software 1711, 1731 may compute or estimate the monitored quantities. The reconfiguring of OTT connection 1750 may include message format, retransmission settings, preferred routing etc.; the reconfiguring need not affect base station 1720, and it may be unknown or imperceptible to base station 1720. Such procedures and functionalities may be known and practiced in the art. In certain embodiments, measurements may involve proprietary UE signaling facilitating host computer 1710's measurements of throughput, propagation times, latency and the like. The measurements may be implemented in that software 1711 and 1731 causes messages to be transmitted, in particular empty or 'dummy' messages, using OTT connection 1750 while it monitors propagation times, errors etc.

Figure 18:
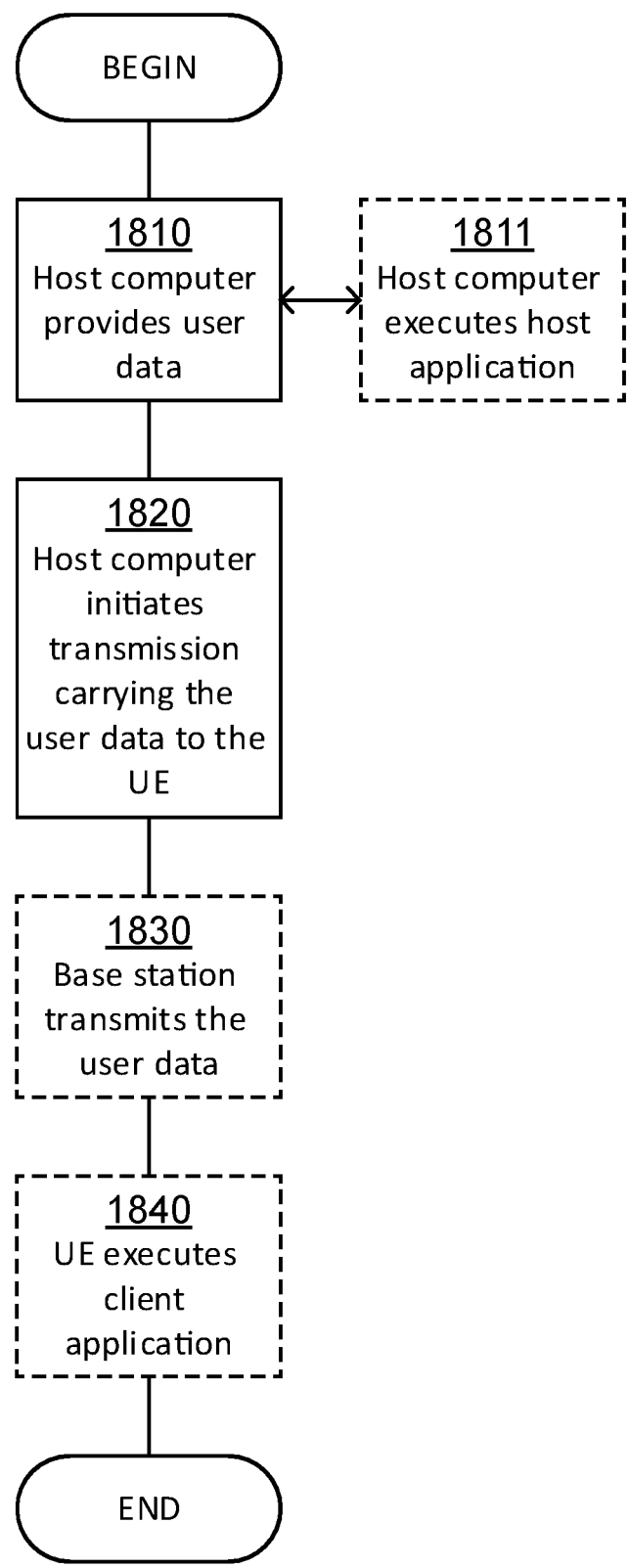
FIGS. 18-21 are flowcharts of methods implemented in a communication system including a host computer, a base station, and a user equipment according to embodiments of the disclosure.

FIG. 18 is a flowchart illustrating a method implemented in a communication system, in accordance with one embodiment. The communication system includes a host computer, a base station and a UE which may be those described with reference to FIGS. 16 and 17. For simplicity of the present disclosure, only drawing references to FIG. 18 will be included in this section. In step 1810, the host computer provides user data. In substep 1811 (which may be optional) of step 1810, the host computer provides the user data by executing a host application. In step 1820, the host computer initiates a transmission carrying the user data to the UE. In step 1830 (which may be optional), the base station transmits to the UE the user data which was carried in the transmission that the host computer initiated, in accordance with the teachings of the embodiments described throughout this disclosure. In step 1840 (which may also be optional), the UE executes a client application associated with the host application executed by the host computer.

Figure 19:
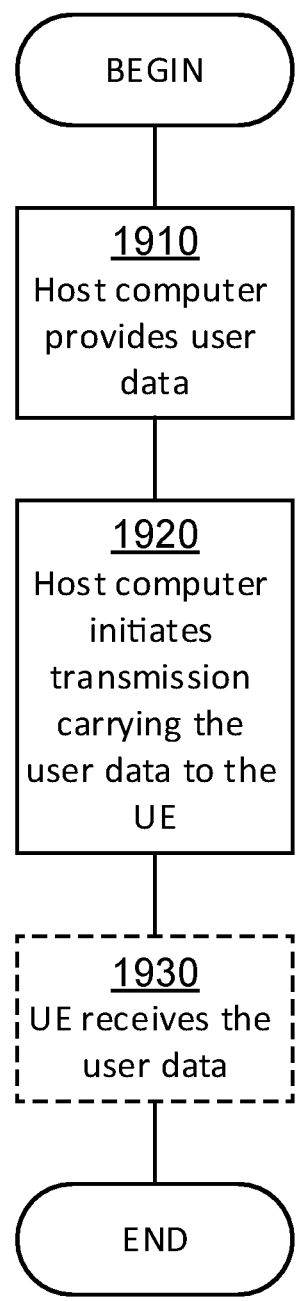

FIG. 19 is a flowchart illustrating a method implemented in a communication system, in accordance with one embodiment. The communication system includes a host computer, a base station and a UE which may be those described with reference to FIGS. 16 and 17. For simplicity of the present disclosure, only drawing references to FIG. 19 will be included in this section. In step 1910 of the method, the host computer provides user data. In an optional substep (not shown) the host computer provides the user data by executing a host application. In step 1920, the host computer initiates a transmission carrying the user data to the UE. The transmission may pass via the base station, in accordance with the teachings of the embodiments described throughout this disclosure. In step 1930 (which may be optional), the UE receives the user data carried in the transmission.

Figure 20:
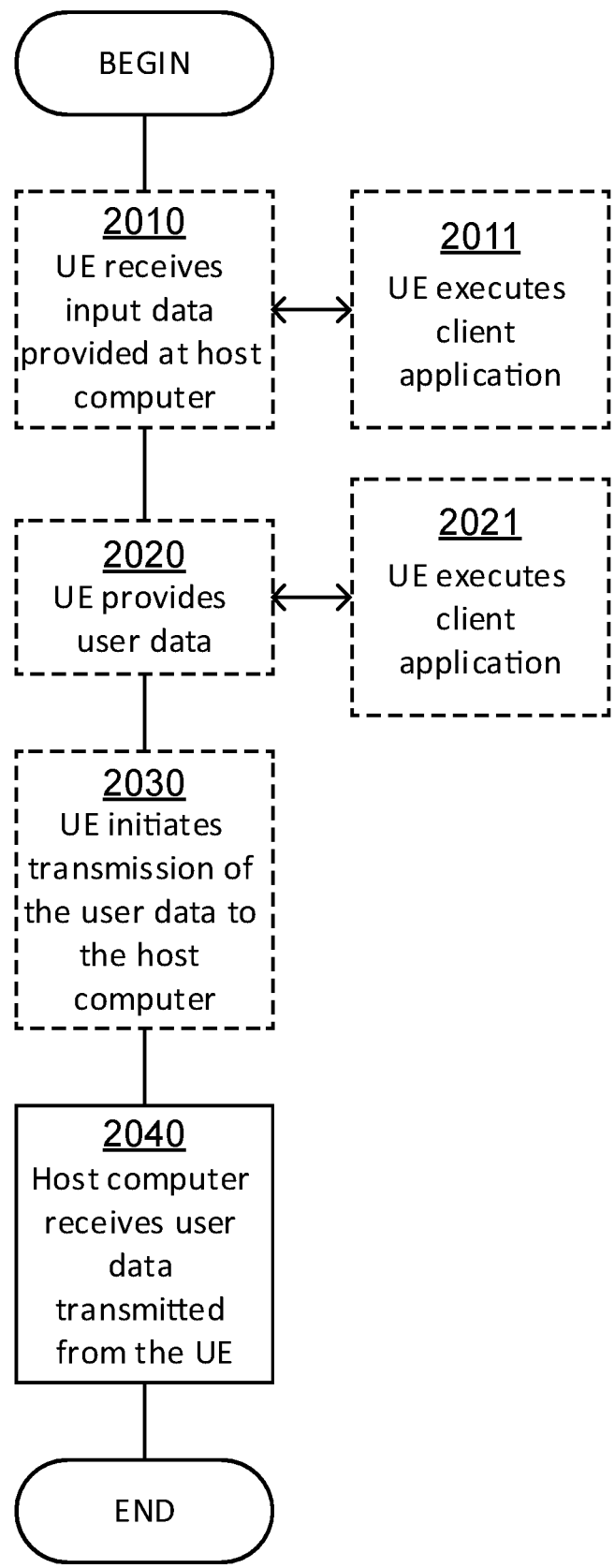

FIG. 20 is a flowchart illustrating a method implemented in a communication system, in accordance with one embodiment. The communication system includes a host computer, a base station and a UE which may be those described with reference to FIGS. 16 and 17. For simplicity of the present disclosure, only drawing references to FIG. 20 will be included in this section. In step 2010 (which may be optional), the UE receives input data provided by the host computer. Additionally or alternatively, in step 2020, the UE provides user data. In substep 2021 (which may be optional) of step 2020, the UE provides the user data by executing a client application. In substep 2011 (which may be optional) of step 2010, the UE executes a client application which provides the user data in reaction to the received input data provided by the host computer. In providing the user data, the executed client application may further consider user input received from the user. Regardless of the specific manner in which the user data was provided, the UE initiates, in substep 2030 (which may be optional), transmission of the user data to the host computer. In step 2040 of the method, the host computer receives the user data transmitted from the UE, in accordance with the teachings of the embodiments described throughout this disclosure.

Figure 21:
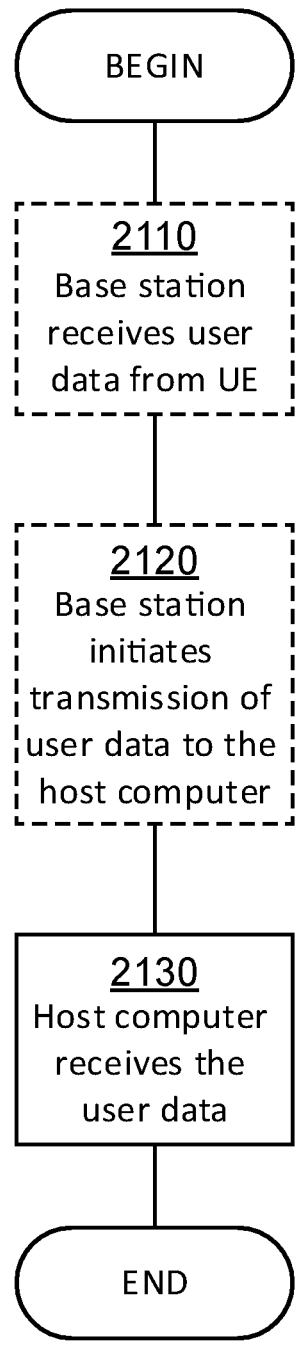

FIG. 21 is a flowchart illustrating a method implemented in a communication system, in accordance with one embodiment. The communication system includes a host computer, a base station and a UE which may be those described with reference to FIGS. 16 and 17. For simplicity of the present disclosure, only drawing references to FIG. 21 will be included in this section. In step 2110 (which may be optional), in accordance with the teachings of the embodiments described throughout this disclosure, the base station receives user data from the UE. In step 2120 (which may be optional), the base station initiates transmission of the received user data to the host computer. In step 2130 (which may be optional), the host computer receives the user data carried in the transmission initiated by the base station.

Figure 22:
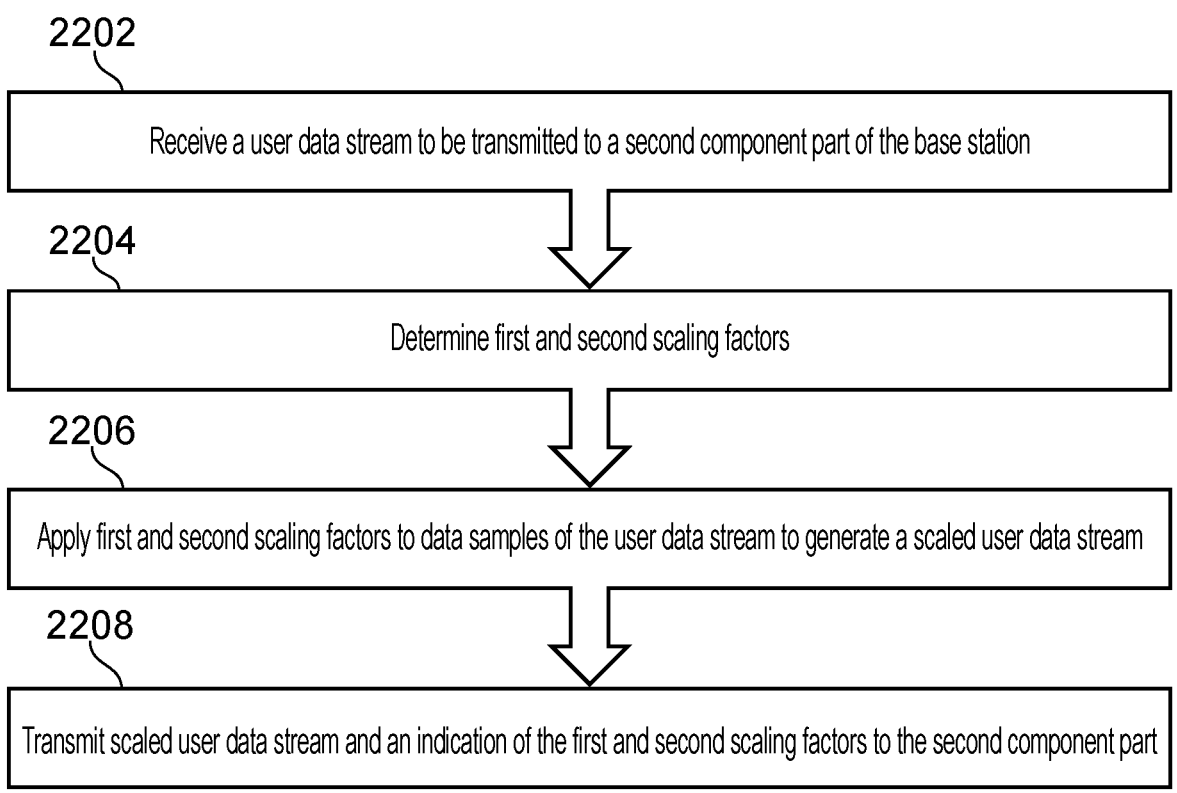
FIG. 22 is a flowchart of a method according to embodiments of the disclosure.

FIG. 22 depicts a method in accordance with particular embodiments. The method may be performed by a first component part of a base station or network node (such as the network node 1360 described above). The first component part comprises one of a central unit and a radio unit. The base station or network node further comprises a second component part, which comprises the other of the central unit and the radio unit.

The method begins at step 2202, in which the first component part receives a user data stream to be transmitted to the second component part. The user data stream comprises a plurality of data samples which are for transmission by the base station over an air interface (i.e. in DL), or which have been received by the base station over the air interface (i.e. in UL).

In step 2204, the first component part determines first and second scaling factors to be applied to the data samples. The first scaling factor is updateable every first plurality of data samples, whereas the second scaling factor is updateable every second plurality of data samples. The second plurality of data samples is less than the first plurality of data samples, such that the second scaling factor is updated more often than the first scaling factor. The first and second scaling factors may be defined as multiplicative factors or exponents, for example. It will be noted that the first and second scaling factors may be defined differently to each other, such that the first scaling factor is defined as an exponent while the second scaling factor is defined as a multiplicative factor (or vice versa).

In one embodiment of the disclosure, the second plurality of data samples are for transmission or were received over time and frequency resources within a single physical resource block of the air interface. Thus the second scaling factor may be updated one or more times while processing the data samples for a single physical resource block. For example, the second plurality of data samples may be for transmission or were received over a single time resource (such as a single symbol) and one or more frequency resources (such as one or more multiple adjacent frequency resources, e.g., subcarriers) within the single physical resource block of the air interface. In the embodiment illustrated in FIG. 5, for example, the second plurality of data samples comprise data samples for two resource elements (e.g., I and Q data samples for each resource element) which are adjacent in the frequency domain.

According to further embodiments, the first plurality of data samples may be for transmission or were received over the frequency resources of an integer number of physical resource blocks and time resources comprising a single physical resource block or a single time slot of the air interface. Thus the first scaling factor may apply to the data samples using the same time resources (such as the same TTI or the same time slot), and multiple or all frequency resources within a carrier or a section within a carrier. The frequency resources may be adjacent in the frequency domain. The example in FIG. 5 shows the first scaling factor being applied to all physical resource blocks in a particular TTI. Thus the first scaling factor may be updated between TTIs, or between some other time resource such as slots (where a TTI has two slots).

The first scaling factor may be determined based on a maximum value in a set of data samples in the user data stream. For example, the set of data samples may comprise an input data set for a Fourier transform module (see FIGS. 7 and 10, for example) or an output data set from a Fourier transform module (see FIGS. 8 and 11, for example).

Figure 6:
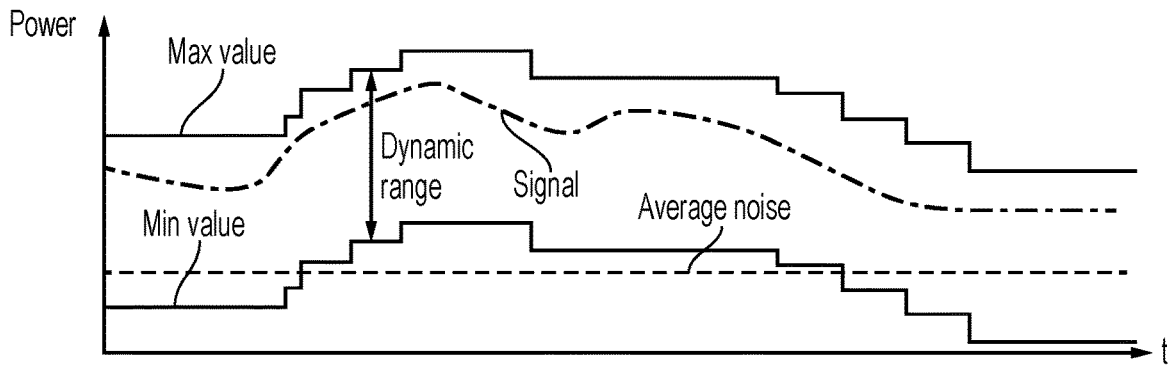
FIG. 6 shows performance of a compression mechanism according to embodiments of the disclosure.

The rate at which the first scaling factor is updated may vary according to whether the first scaling factor is to be increased or decreased. In one embodiment, the first scaling data may be updated relatively quickly for increases in the scaling factor, but relatively slowly for decreases in the scaling factor. See FIGS. 6 and 9, for example. The first scaling factor may be updated by maintaining a dummy value for the first scaling factor, and replacing a used value for the first scaling factor with the dummy value upon determining that one or more conditions are met. For example, the one or more conditions may comprise a condition that a threshold period of time has elapsed since the first scaling factor was previously updated (see FIG. 9).

In step 2206, the first component part applies the first and second scaling factors to the data samples to generate a scaled user data stream. In embodiments where the user data is transmitted or received over the air interface via a plurality of antennas of the radio unit, the same first scaling factor may be applied to data samples which are for transmission via those multiple antennas of the radio unit, or which are received by multiple antennas of the radio unit. Further, the first scaling factor may be applied to data samples prior to an application of beamforming weights to the data samples, and wherein the second scaling factor is applied to data samples after the application of beamforming weights to the data samples. See FIGS. 10 and 11, for example.

In step 2208, the first component part transmits the scaled user data stream and an indication of the first and second scaling factors to the second component part, e.g., over the fronthaul interface or network.

For example, the scaled user data stream may be transmitted to the second component part in one or more data packets, each data packet comprising one or more data samples and an indication of the second scaling factor. See FIG. 12, for example.

Each data packet may comprise multiple second pluralities of data samples, and respective indications of the second scaling factor applied to each second plurality of data samples. In some embodiments, each data packet may further comprises an indication of the first scaling factor which is applied to the data samples contained therein. However, in other embodiments the indication of the first scaling factor is transmitted to the second component part in a message which is separate from the one or more data packets comprising the scaled user data stream. For example, the indication of the first scaling factor may be transmitted in a management message, or a DACI transmitted between the first and second component parts of the base station.

Figure 23:
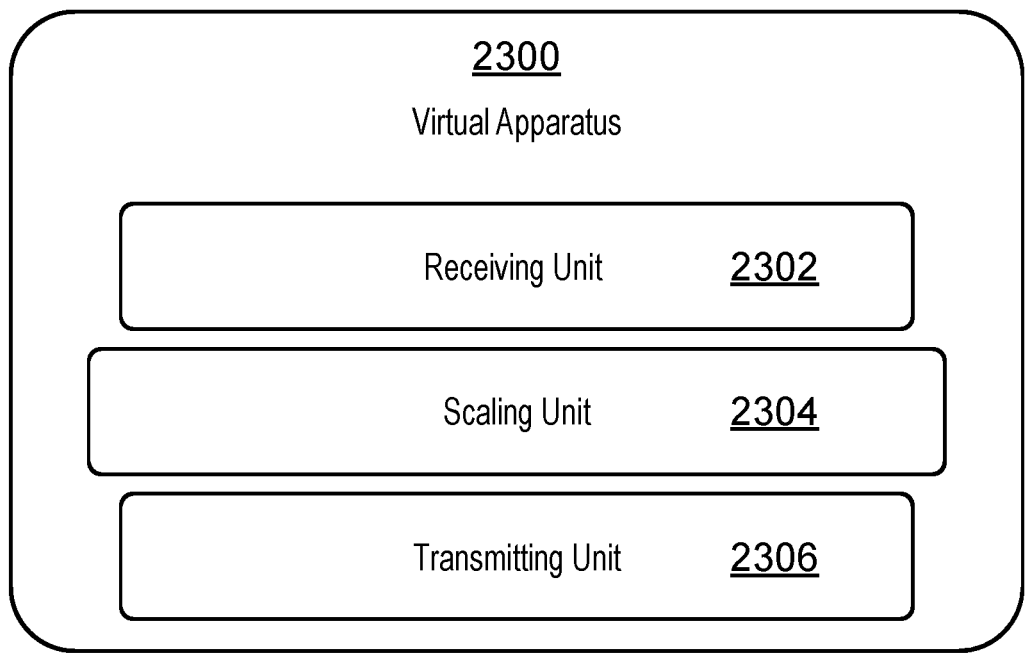
FIG. 23 shows a virtualization apparatus according to embodiments of the disclosure.

FIG. 23 illustrates a schematic block diagram of an apparatus 2300 in a wireless network (for example, the wireless network shown in FIG. 13). The apparatus may be implemented in a first component part of a network node (e.g., network node 1360 shown in FIG. 13), such as one of a central unit and a radio unit. The network node further comprises a second component part, which is the other of the central unit and the radio unit. Thus, when the apparatus 2300 is implemented in a central unit, the apparatus 2300 is configured to transmit user data to a radio unit; when the apparatus 2300 is implemented in a radio unit, the apparatus 2300 is configured to transmit user data to a central unit. Apparatus 2300 is operable to carry out the example method described with reference to FIG. 22 and possibly any other processes or methods disclosed herein. It is also to be understood that the method of FIG. 22 is not necessarily carried out solely by apparatus 2300. At least some operations of the method can be performed by one or more other entities.

Virtual Apparatus 2300 may comprise processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory includes program instructions for executing one or more telecommunications and/or data communications protocols as well as instructions for carrying out one or more of the techniques described herein, in several embodiments. In some implementations, the processing circuitry may be used to cause receiving unit 2302, scaling unit 2304 and transmitting unit 2306, and any other suitable units of apparatus 2300 to perform corresponding functions according one or more embodiments of the present disclosure.

As illustrated in FIG. 23, apparatus 2300 includes receiving unit 2302, scaling unit 2304 and transmitting unit 2306. Receiving unit 2302 is configured to receive a user data stream to be transmitted to the second component part. The user data stream comprises a plurality of data samples which are for transmission by the network node (e.g., base station) over an air interface, or which have been received by the network node (e.g., base station) over the air interface. The scaling unit 2304 is configured to apply first and second scaling factors to the data samples to generate a scaled user data stream. The first scaling factor is updateable every first plurality of data samples, whereas the second scaling factor is updateable every second plurality of data samples. The second plurality of data samples is less than the first plurality of data samples. The transmitting unit 2306 is configured to transmit the scaled user data stream and an indication of the first and second scaling factors to the second component part.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

For the avoidance of doubt, the following numbered paragraphs set out embodiments of the disclosure.

Group B Embodiments

1. A method performed by a first component part of a base station, the first component part comprising one of a central unit and a radio unit, the base station further comprising a second component part, the second component part comprising the other of the central unit and the radio unit, the method comprising:
   receiving a user data stream to be transmitted to the second component part, the user data stream comprising a plurality of data samples which are for transmission by the base station over an air interface, or which have been received by the base station over the air interface;
   applying first and second scaling factors to the data samples to generate a scaled user data stream, wherein the first scaling factor is updateable every first plurality of data samples, wherein the second scaling factor is updateable every second plurality of data samples, and wherein the second plurality of data samples is less than the first plurality of data samples; and
   transmitting the scaled user data stream and an indication of the first and second scaling factors to the second component part.
2. The method of embodiment 1, wherein the second plurality of data samples are for transmission or were received over time and frequency resources within a single physical resource block of the air interface.

3. The method of embodiment 1 or 2, wherein the second plurality of data samples are for transmission or were received over a single time resource and one or more frequency resources within the single physical resource block of the air interface.
4. The method of embodiment 3, wherein the second plurality of data samples are for transmission or were received over a plurality of adjacent frequency resources within the single physical resource block of the air interface.
5. The method of embodiment 3 or 4, wherein the single time resource comprises a single symbol of the air interface, and wherein the one or more frequency resources comprise one or more subcarriers of the air interface.
6. The method of any preceding embodiment, wherein the first plurality of data samples are for transmission or were received over the frequency resources of an integer number of physical resource blocks and time resources comprising a single physical resource block or a single time slot of the air interface.
7. The method of embodiment 6, wherein the integer number of physical resource blocks are adjacent in the frequency domain.
8. The method of embodiment 6 or 7, wherein the integer number of physical resource blocks comprise all of the physical resource blocks within a carrier of the air interface.
9. The method of embodiment 6 or 7, wherein the integer number of physical resource blocks comprise all of the physical resource blocks of a single section within a carrier of the air interface.
10. The method of any preceding embodiment, further comprising updating the first scaling factor based on a maximum value in a set of data samples in the user data stream.
11. The method of embodiment 10, wherein the set of data samples comprises an input data set for a Fourier transform module.
12. The method of embodiment 10, wherein the set of data samples comprises an output data set from a Fourier transform module.
13. The method of any of embodiments 10 to 12, wherein the first scaling factor is updateable at a first frequency for increases in the first scaling factor, and at a second frequency for decreases in the first scaling factor, wherein the second frequency is lower than the first frequency.
14. The method of any of embodiments 10 to 13, wherein the step of updating the first scaling factor comprises maintaining a dummy value for the first scaling factor, and replacing a utilized value for the first scaling factor with the dummy value responsive to a determination that one or more conditions are met.
15. The method of embodiment 14, wherein the one or more conditions comprise a condition that a threshold period of time has elapsed since the first scaling factor was previously updated.
16. The method of any preceding embodiment, wherein the first and second scaling factor each reduce a dynamic range of the data samples.
17. The method of any preceding embodiment, wherein the first and second scaling factors comprise one or more of a multiplicative factor and an exponent.
18. The method of any preceding embodiment, wherein the same first scaling factor is applied to data samples which are for transmission via multiple antennas of the radio unit, or which are received by multiple antennas of the radio unit.
19. The method of embodiment 18, wherein the first scaling factor is applied to data samples prior to an application of beamforming weights to the data samples, and wherein the second scaling factor is applied to data samples after the application of beamforming weights to the data samples.
20. The method of any preceding embodiment, wherein the scaled user data stream is transmitted to the second component part in one or more data messages, each data message comprising one or more data samples and an indication of the second scaling factor.
21. The method of embodiment 20, wherein each data message comprises multiple second pluralities of data samples, and respective indications of the second scaling factor applied to each second plurality of data samples.
22. The method of embodiment 20 or 21, wherein each data message comprises an indication of the first scaling factor.
23. The method of embodiment 22 when dependent on embodiment 21, wherein each data message comprises an indication of the single first scaling factor applied to the multiple second pluralities of data samples.
24. The method of embodiment 20 or 21, wherein the indication of the first scaling factor is transmitted to the second component part in a message which is separate from the one or more data message comprising the scaled user data stream.
25. The method of any preceding embodiment, further comprising updating the first scaling factor between consecutive slots of the air interface.
26. The method of any preceding embodiment, wherein the scaled user data stream is transmitted to the second component part over a fronthaul interface.
27. The method of any of the previous embodiments, further comprising:
obtaining user data; and
forwarding the user data to a host computer or a wireless device.

Group C Embodiments

28. A base station, the base station comprising:
processing circuitry configured to perform any of the steps of any of the Group B embodiments;
power supply circuitry configured to supply power to the base station.
29. A component part for a base station, the base station comprising:
processing circuitry configured to perform any of the steps of any of the Group B embodiments;
power supply circuitry configured to supply power to the base station.
30. The component part according to the preceding embodiment, wherein the component part comprises a central unit or a radio unit.
31. A communication system including a host computer comprising:
processing circuitry configured to provide user data; and
a communication interface configured to forward the user data to a cellular network for transmission to a user equipment (UE), wherein the cellular network comprises a base station having a radio interface and processing circuitry, the base station's processing circuitry configured to perform any of the steps of any of the Group B embodiments.

32. The communication system of the previous embodiment further including the base station.

33. The communication system of the previous 2 embodiments, further including the UE, wherein the UE is configured to communicate with the base station.

34. The communication system of the previous 3 embodiments, wherein:
the processing circuitry of the host computer is configured to execute a host application, thereby providing the user data; and
the UE comprises processing circuitry configured to execute a client application associated with the host application.

35. A method implemented in a communication system including a host computer, a base station and a user equipment (UE), the method comprising:
at the host computer, providing user data; and
at the host computer, initiating a transmission carrying the user data to the UE via a cellular network comprising the base station, wherein the base station performs any of the steps of any of the Group B embodiments.

36. The method of the previous embodiment, further comprising, at the base station, transmitting the user data.

37. The method of the previous 2 embodiments, wherein the user data is provided at the host computer by executing a host application, the method further comprising, at the UE, executing a client application associated with the host application.

38. A user equipment (UE) configured to communicate with a base station, the UE comprising a radio interface and processing circuitry configured to performs the of the previous 3 embodiments.

39. A communication system including a host computer comprising a communication interface configured to receive user data originating from a transmission from a user equipment (UE) to a base station, wherein the base station comprises a radio interface and processing circuitry, the base station's processing circuitry configured to perform any of the steps of any of the Group B embodiments.

40. The communication system of the previous embodiment further including the base station.

41. The communication system of the previous 2 embodiments, further including the UE, wherein the UE is configured to communicate with the base station.

42. The communication system of the previous 3 embodiments, wherein:
the processing circuitry of the host computer is configured to execute a host application;
the UE is configured to execute a client application associated with the host application, thereby providing the user data to be received by the host computer.

43. A method implemented in a communication system including a host computer, a base station and a user equipment (UE), the method comprising:
at the host computer, receiving, from the base station, user data originating from a transmission which the base station has received from the UE, wherein the UE performs any of the steps of any of the Group A embodiments.

44. The method of the previous embodiment, further comprising at the base station, receiving the user data from the UE.

45. The method of the previous 2 embodiments, further comprising at the base station, initiating a transmission of the received user data to the host computer.

The invention claimed is:

1. A method performed by a first component part of a base station, the first component part comprising one of a central unit and a radio unit, the base station further comprising a second component part, the second component part comprising the other of the central unit and the radio unit, the method comprising:
receiving a user data stream to be transmitted to the second component part, the user data stream comprising a plurality of data samples which are for transmission by the base station over an air interface, or which have been received by the base station over the air interface;
applying first and second scaling factors to the data samples to generate a scaled user data stream, wherein the first scaling factor is updateable every first plurality of data samples, wherein the second scaling factor is updateable every second plurality of data samples, and wherein the second plurality of data samples is less than the first plurality of data samples; and
transmitting the scaled user data stream and an indication of the first and second scaling factors to the second component part.

2. The method of claim 1, wherein the second plurality of data samples are for transmission or were received over time and frequency resources within a single physical resource block of the air interface.

3. The method of claim 1, wherein the second plurality of data samples are for transmission or were received over a single time resource and one or more frequency resources within the single physical resource block of the air interface.

4. The method of claim 3, wherein the second plurality of data samples are for transmission or were received over a plurality of adjacent frequency resources within the single physical resource block of the air interface.

5. The method of claim 3, wherein the single time resource comprises a single symbol of the air interface, and wherein the one or more frequency resources comprise one or more subcarriers of the air interface.

6. The method of claim 1, wherein the first plurality of data samples are for transmission or were received over the frequency resources of an integer number of physical resource blocks and time resources comprising a single physical resource block or a single time slot of the air interface.

7. The method of claim 6, wherein the integer number of physical resource blocks are adjacent in the frequency domain.

8. The method of claim 6, wherein the integer number of physical resource blocks comprise all of the physical resource blocks within a carrier of the air interface, or within a single section of a carrier of the air interface.

9. The method of claim 1, further comprising updating the first scaling factor based on a maximum value in a set of data samples in the user data stream.

10. The method of claim 9, wherein the set of data samples comprises an input data set for a Fourier transform module or an output data set from a Fourier transform module.

11. The method of claim 9, wherein the first scaling factor is updateable at a first frequency for increases in the first scaling factor, and at a second frequency for decreases in the first scaling factor, wherein the second frequency is lower than the first frequency.

12. The method of claim 9, wherein the step of updating the first scaling factor comprises maintaining a dummy value for the first scaling factor, and replacing a utilized value for the first scaling factor with the dummy value responsive to a determination that one or more conditions are met.

13. The method of claim 12, wherein the one or more conditions comprise a condition that a threshold period of time has elapsed since the first scaling factor was previously updated.

14. The method of claim 1, wherein the first and second scaling factor each reduce a dynamic range of the data samples.

15. The method of claim 1, wherein the first and second scaling factors comprise one or more of a multiplicative factor and an exponent.

16. The method of claim 1, wherein the same first scaling factor is applied to data samples which are for transmission via multiple antennas of the radio unit, or which are received by multiple antennas of the radio unit.

17. The method of claim 16, wherein the first scaling factor is applied to data samples prior to an application of beamforming weights to the data samples, and wherein the second scaling factor is applied to data samples after the application of beamforming weights to the data samples.

18. The method of claim 1, wherein the scaled user data stream is transmitted to the second component part in one or more data messages, each data message comprising one or more data samples and an indication of the second scaling factor.

19. A base station, the base station comprising:
processing circuitry in a first component part of the base station, the processing circuitry configured to:
receive a user data stream to be transmitted to a second component part of the base station, the user data stream comprising a plurality of data samples which are for transmission by the base station over an air interface, or which have been received by the base station over the air interface;
apply first and second scaling factors to the data samples to generate a scaled user data stream, wherein the first scaling factor is updateable every first plurality of data samples, wherein the second scaling factor is updateable every second plurality of data samples, and wherein the second plurality of data samples is less than the first plurality of data samples; and
transmit the scaled user data stream and an indication of the first and second scaling factors to the second component part; and
power supply circuitry configured to supply power to the base station;
wherein the first component part is one of a central unit and a radio unit, and the second component part is the other of the central unit and the radio unit.

20. A first component part for a base station, the first component part comprising one of a central unit and a radio unit, the base station further comprising a second component part, the second component part comprising the other of the central unit and the radio unit, the first component part comprising:
power supply circuitry configured to supply power to the first component part; and
processing circuitry configured to:
receive a user data stream to be transmitted to the second component part, the user data stream comprising a plurality of data samples which are for transmission by the base station over an air interface, or which have been received by the base station over the air interface;
apply first and second scaling factors to the data samples to generate a scaled user data stream, wherein the first scaling factor is updateable every first plurality of data samples, wherein the second scaling factor is updateable every second plurality of data samples, and wherein the second plurality of data samples is less than the first plurality of data samples; and
transmit the scaled user data stream and an indication of the first and second scaling factors to the second component part.

* * * * *